United States Patent
Kitayama

[19]

[11] Patent Number: 6,137,736
[45] Date of Patent: Oct. 24, 2000

[54] SEMICONDUCTOR MEMORY DEVICE

[75] Inventor: Makoto Kitayama, Tokyo, Japan

[73] Assignee: NEC Corporation, Tokyo, Japan

[21] Appl. No.: 09/220,770

[22] Filed: Dec. 28, 1998

[30] Foreign Application Priority Data

Dec. 26, 1997 [JP] Japan .................................. 9-359450

[51] Int. Cl.⁷ .................................................. G11C 7/00
[52] U.S. Cl. ...................................... 365/200; 365/230.03
[58] Field of Search ................................ 365/200, 230.03

[56] References Cited

U.S. PATENT DOCUMENTS 5,576,633  11/1996  Rountree et al. ....................... 365/200

Primary Examiner—David Nelms
Assistant Examiner—M. Tran
Attorney, Agent, or Firm—Young & Thompson

[57] ABSTRACT

The present invention provides a semiconductor memory device having a block selective line selecting circuit connected to a plurality of block selective common lines, each of which is commonly connected to both corresponding normal and redundant memory cell blocks in normal and redundant memory cell arrays, wherein the block selective line selecting circuit is switched into a first state to permit transmissions of decoded normal row address signals having informations of designating a normal row address to which a normal memory cell to be selected belongs when a non-defective normal memory cell is selected in the normal memory cell array, and also the block selective line selecting circuit is switched into a second state to permit transmissions of decoded redundant row address signals having informations of designating a redundant row address to which a redundant memory cell to be selected belongs when a defective normal memory cell is selected in the normal memory cell array.

21 Claims, 4 Drawing Sheets

SEMICONDUCTOR MEMORY DEVICE

BACKGROUND OF THE INVENTION

The present invention relates to a semiconductor memory device, and more particularly to a semiconductor memory device having a redundant memory cell array for remedy of defective memory cells, wherein the semiconductor memory device is of a divided word line system.

Defective memory cells may be formed due to micron size dust particles that are present even in diffusion processes carried out under a clean environment in manufacturing processes for the semiconductor memory device. Actually, it is difficult to completely prevent formations of the defective memory cells due to such dust particles, for which reason most semiconductor memory devices are provided with redundant memory cells for remedy of the defective memory cells.

After the diffusion processes have been completed, then the memory test is carried out by use of a tester in order to detect any defective memory cells in a semiconductor chip. The defective memory cells may be distributed over the cell array region in 1-bit unit or aligned along a word line. Those defective memory cells are required to be replaced by the redundant memory cells. A calculation is made by taking defective patterns into account to decide, which fuses in a fuse circuit should be disconnected, in order to carry out the most efficient replacement of the defective memory cells by the redundant memory cells. If addresses corresponding to the defective memory cells are selected, then the redundant memory cells will serve in place of the defective memory cells for read or write operations, so that the semiconductor memory device may be used as non-defective device.

If, however, the redundant memory cells replaced for the defective memory cells, which addresses are selected, are defective, then this means that the semiconductor memory device is defective, whereby a percent non-defective is dropped or the yield is reduced.

Normally, the semiconductor memory device is provided with a plurality of redundant word lines and a plurality of redundant bit lines, so that one redundant line is allocated to one defective.

It is effective that, during the wafer test, not only the normal memory cells but also the redundant memory cells are checked to detect not only any defective memory cells but also any defective redundant memory cells, so as to prevent that defective redundant memory cells are allocated to the defective memory cells. This results in an increase in the percent non-defective or the yield of the chip. This technique is disclosed in Japanese laid-open patent publication No. 8-147995.

In the meantime, the semiconductor memory device such as a static random access memory device utilizes the divided-word system, wherein the memory cell array is divided into a plurality of column blocks extending along a column direction so that individual column blocks select rows. Namely, in read and write operations, stationary currents are applied to all of the memory cells connected to a selected word line. In order to reduce the power consumption of the semiconductor memory device, it is effective to reduce the stationary currents by dividing the memory cell array into the column blocks so that the individual column blocks select rows.

FIG. 1 is a block diagram illustrative of a conventional divided-word semiconductor memory device with redundant memory cell arrays for remedy of defective memory cells in normal memory cell arrays, which is disclosed in the above publication.

The semiconductor memory device has a memory cell array having memory cells aligned in a matrix. This memory cell array comprises a normal memory cell array 21a having normal memory cells Ma aligned in matrix and a redundant memory cell array 21b having redundant memory cells Mb aligned in a matrix.

The normal memory cell array 21a comprises memory blocks 21a-1, 21a-2, 21a-3, . . . 21a-h, which are aligned in a row direction, wherein each memory block extends in a longitudinal direction parallel to a column direction. The memory blocks 21a-1, 21a-2, 21a-3, . . . 21a-h correspond to block selective lines Ba1, Ba2, Ba3, . . . Bah respectively, wherein the memory blocks 21a-1, 21a-2, 21a-3, . . . 21a-h are connected to the block selective lines Ba1, Ba2, Ba3, . . . Bah respectively.

The redundant memory cell array 21b comprises redundant memory blocks 21b-1, 21b-2, 21b-3, . . . 21b-i, which are aligned in a row direction, wherein each redundant memory block extends in a longitudinal direction parallel to a column direction. The redundant memory blocks 21b-1, 21b-2, 21b-3, . . . 21b-i are correspondent to redundant block selective lines Bb1, Bb2, Bb3, . . . Bbi respectively, wherein the redundant memory blocks 21b-1, 21b-2, 21b-3, . . . 21b-i are connected with the redundant block selective lines Bb1, Bb2, Bb3, . . . Bbi respectively.

The semiconductor memory device also has word lines Wa1, Wa2, Wa3, . . . Wam which are allocated to the normal memory cells Ma in the normal memory cell array 21a and redundant word lines Wb1, Wb2, Wb3, . . . Wbn which are allocated to the redundant memory cells Mb in the redundant memory cell array 21b. The individual word lines Wa1, Wa2, Wa3, . . . Wam have corresponding sub-word lines SWa respectively so that the normal memory cells Ma are directly connected with the sub-word lines SWa. The individual redundant word lines Wb1, Wb2, Wb3, . . . Wbn have corresponding redundant sub-word lines SWb respectively so that the redundant memory cells Mb are directly connected with the redundant sub-word lines SWb.

The normal memory cell array 21a further has sub-word drivers 22a corresponding to the individual sub-word lines SWa, so that the individual sub-word lines SWa are connected with the corresponding sub-word drivers 22a. The sub-word drivers 22a are respectively connected with the word lines Wa1, Wa2, Wa3, . . . Warn corresponding to the sub-word lines SWa, with which the sub-word drivers 22a are connected, whereby the individual sub-word lines SWa are connected through the sub-word drivers 22a to the corresponding word lines Wa1, Wa2, Wa3, . . . Wam. Further, the individual sub-word drivers 22a are connected with the block selective lines Ba1, Ba2, Ba3, . . . Bah corresponding to the individual memory blocks 21a-1, 21a-2, 21a-3, . . . 21a-h having the sub-word lines SWa connected with the sub-word drivers 22a, so that the individual sub-word lines SWa are connected through the sub-word drivers 22a to the block selective lines Ba1, Ba2, Ba3, . . . Bah. Namely, the individual sub-word lines SWa are connected through the sub-word drivers 22a both to the corresponding block selective lines Ba1, Ba2, Ba3, . . . Bah and to the corresponding word lines Wa1, Wa2, Wa3, . . . Wam.

The redundant memory cell array 21b further has redundant sub-word drivers 22b corresponding to the individual redundant sub-word lines SWb, so that the individual redundant sub-word lines SWb are connected to the corresponding redundant sub-word drivers 22b. The redundant sub-word drivers 22b are respectively connected to the redundant word lines Wb1, Wb2, Wb3, . . . Wbn corresponding to the redundant sub-word lines SWb, with which the redundant sub-word drivers 22b are connected, whereby the individual redundant sub-word lines SWb are connected through the redundant sub-word drivers 22b to the corresponding redundant word lines Wb1, Wb2, Wb3, . . . Wbn. Further, the individual redundant sub-word drivers 22b are connected with the redundant block selective lines Bb1, Bb2, Bb3, . . . Bbi corresponding to the individual redundant memory blocks 21b-1, 21b-2, 21b-3, . . . 21b-i having the redundant sub-word lines SWb connected with the redundant sub-word drivers 22b, so that the individual redundant sub-word lines SWb are connected through the redundant sub-word drivers 22b to the redundant block selective lines Bb1, Bb2, Bb3, . . . Bbi. Namely, the individual redundant sub-word lines SWb are connected through the redundant sub-word drivers 22b both to the corresponding redundant block selective lines Bb1, Bb2, Bb3, . . . Bbi and to the corresponding redundant word lines Wb1, Wb2, Wb3, . . . Wbn.

The semiconductor memory device further has digit lines which are connected to the normal memory cells Ma and the redundant memory cells Mb, so that digital signals are transmitted on the digit lines, whereby the digital signals are written into the normal memory cells Ma or the redundant memory cells Mb and also the digital signals are read out from the normal memory cells Ma or the redundant memory cells Mb.

The above normal word lines Wa1, Wa2, Wa3, . . . Wam and the redundant word lines Wb1, Wb2, Wb3, . . . Wbn extend in the row direction, whilst the block selective lines Ba1, Ba2, Ba3, . . . Bah and the redundant block selective lines Bb1, Bb2, Bb3, . . . Bbi extend in the column direction. The sub-word drivers 22a are positioned near crossing points of the normal word lines Wa1, Wa2, Wa3, . . . Wam and the block selective lines Ba1, Ba2, Ba3, . . . Bah, so that the sub-word drivers 22a are connected both with the normal word lines Wa1, Wa2, Wa3, . . . Wam and with the block selective lines Ba1, Ba2, Ba3, . . . Bah. The redundant sub-word drivers 22b are positioned near crossing points of the redundant word lines Wb1, Wb2, Wb3, . . . Wbn and the redundant block selective lines Bb1, Bb2, Bb3, . . . Bbi, so that the redundant sub-word drivers 22b are connected both with the redundant word lines Wb1, Wb2, Wb3, . . . Wbn and with the redundant block selective lines Bb1, Bb2, Bb3, . . . Bbi.

If one of the normal word lines Wa1, Wa2, Wa3, . . . Wam and one of the block selective lines Ba1, Ba2, Ba3, . . . Bah are respectively selected, then the sub-word driver 22a positioned near a crossing point of the selected word line and the selected block selective line is operated to connect the corresponding sub-word line SWa to the selected word line so as to drive all of the normal memory cells Ma directly connected with the sub-word driver 22a.

If one of the redundant word lines Wb1, Wb2, Wb3, . . . Wbn and one of the redundant block selective lines Bb1, Bb2, Bb3, . . . Bbi are respectively selected, then the redundant sub-word driver 22b positioned near a crossing point of the selected redundant word line and the selected redundant block selective line is operated to connect the corresponding redundant sub-word line SWb to the selected redundant word line so as to drive all of the redundant memory cells Mb directly connected with the redundant sub-word driver 22b.

The semiconductor memory device has a row address circuit 25 which generates row address signals X0, X1, X2, X3 . . . Xj. The semiconductor memory device also has a word line selective circuit 23a which is connected to the row address circuit 25 for receiving the row address signals X0, X1, X2, X3 . . . Xj from the row address circuit 25 so that the word line selective circuit 23a is operated to select any one of the word lines Wa1, Wa2, Wa3, . . . Wam in accordance with the row address signals X0, X1, X2, X3 . . . Xj. The semiconductor memory device also has a redundant word line selective circuit 23b which is connected to the row address circuit 25 for receiving the row address signals X0, X1, X2, X3 . . . -Xj from the row address circuit 25 so that the redundant word line selective circuit 23b is operated to select any one of the redundant word lines Wb1, Wb2, Wb3, . . . Wbm in accordance with the row address signals X0, X1, X2, X3 . . . Xj.

The semiconductor memory device has a redundant fuse circuit 26 which generates a redundant enable signal EN and redundant address signals XRED0, XRED1, XRED2, XRED3, . . . XREDk.

The semiconductor memory device also has a block selective line selecting circuit 24 which is connected to the row address circuit 25 for receiving the row address signals X0, X1, X2, X3 . . . Xj from the row address circuit 25. The block selective line selecting circuit 24 is also connected to the redundant fuse circuit 26 for receiving the redundant enable signal EN from the redundant fuse circuit 26. The block selective line selecting circuit 24 also receives a test mode signal TRED externally supplied. The block selective line selecting circuit 24 is operated to select any one of the block selective lines Ba1, Ba2, Ba3, . . . Bah in accordance with the row address signals X0, X1, X2, X3 . . . Xj, the redundant enable signal EN, and the test mode signal TRED.

The semiconductor memory device has a row address decode circuit 28 which is connected to the row address circuit 25 for receiving the row address signals X0, X1, X2, X3 . . . Xj from the row address circuit 25 as well as which receives the test mode signal TRED externally supplied, so that the row address decode circuit 28 is operated to generate redundant block selective line enable signals which designates any one of the redundant block selective lines Bb1, Bb2, Bb3, . . . Bbi.

The semiconductor memory device also has a redundant block selective line selecting circuit 27 which is connected to the redundant fuse circuit 26 for receiving the redundant address signals XRED0, XRED1, XRED2, XRED3, . . . XREDk from the redundant fuse circuit 26. The redundant block selective line selecting circuit 27 also receives a test mode signal TRED externally supplied. The redundant block selective line selecting circuit 27 is operated to select any one of the redundant block selective lines Bb1, Bb2, Bb3, . . . Bbi in accordance with the redundant block selective line enable signals, the redundant address signals XRED0, XRED1, XRED2, XRED3, . . . XREDk, and the test mode signal TRED.

FIG. 2 is a block diagram illustrative of circuit configurations of the block selective line selecting circuit 24, the redundant block selective line selecting circuit 27, and the row address decoder circuit 28 in the conventional divided-word semiconductor memory device with redundant memory cell arrays in FIG. 1.

The block selective line selecting circuit 24 comprises a row address decode section 31 and a block selective line disable section 32. The row address decode section 31 is connected to the row address circuit 25 for receiving the row address signals X0, X1, X2, X3 . . . Xj from the row address circuit 25 and subsequent decoding operations for decoding the row address signals X0, X1, X2, X3 . . . Xj into row address decode signals Da1, Da2, Da3, . . . Dah. The block selective line disable section 32 is connected to the redundant fuse circuit 26 for receiving the redundant enable signal EN from the redundant fuse circuit 26. The block selective line disable section 32 also receives the test mode signal TRED externally supplied. The block selective line disable section 32 is also connected to the row address decode section 31 for receiving the row address decode signals Da1, Da2, Da3, . . . Dah from the row address decode section 31. The block selective line disable section 32 is also connected to the block selective lines Ba1, Ba2, Ba3, . . . Bah. The row address decode signals Da1, Da2, Da3, . . . Dah correspond to the block selective lines Ba1, Ba2, Ba3, . . . Bah, respectively. The row address signals X0, X1, X2, X3 . . . Xj supplied from the row address circuit 25 have information of selecting any one of the block selective lines Ba1, Ba2, Ba3, Bah. The row address decode section 31 decodes the row address signals X0, X1, X2, X3 . . . Xj into the row address decode signals Da1, Da2, Da3, . . . Dah, wherein a corresponding one of the row address decode signals Da1, Da2, Da3, . . . Dah to the selecting one of the block selective lines Ba1, Ba2, Ba3, . . . Bah is made by the row address decode section 31 into a selecting level, whilst the remaining row address decode signals are made into a non-selecting level. If both the redundant enable signal EN supplied from the redundant fuse circuit 26 and the test mode signal TRED externally supplied are in the inactive level, then the block selective line disable section 32 is operated to connect the block selective lines Ba1, Ba2, Ba3, . . . Bah into the row address decode section 31 so as to permit transmissions of the row address decode signals Da1, Da2, Da3, . . . Dah onto the block selective lines Ba1, Ba2, Ba3, . . . Bah respectively. If at least either the redundant enable signal EN supplied from the redundant fuse circuit 26 or the test mode signal TRED externally supplied is in the active level, then the block selective line disable section 32 is operated to disconnect the block selective lines Ba1, Ba2, Ba3, . . . Bah from the row address decode section 31 so that no signals are transmitted onto the block selective lines Ba1, Ba2, Ba3, . . . Bah.

The redundant block selective line selecting circuit 27 comprises a redundant row address decode section 33 and a redundant block selective line disable section 34. The redundant row address decode section 33 is connected to the redundant fuse circuit 26 for receiving the redundant address signals XRED0, XRED1, XRED2, XRED3, . . . XREDk from the redundant fuse circuit 26 and subsequent decoding operations for decoding the redundant address signals XRED0, XRED1, XRED2, XRED3, . . . XREDk into redundant row address decode signals Db1, Db2, Db3, . . . Dbi. The redundant block selective line disable section 34 receives the test mode signal TRED externally supplied. The redundant block selective line disable section 34 is also connected to the redundant row address decode section 33 for receiving the redundant row address decode signals Db1, Db2, Db3, . . . Dbi from the redundant row address decode section 33. The redundant block selective line disable section 34 is also connected to the redundant block selective lines Bb1, Bb2, Bb3, . . . Bbi. The redundant row address decode signals Db1, Db2, Db3, . . . Dbi correspond to the redundant block selective lines Ba1, Ba2, Ba3, . . . Bah, respectively. The redundant address signals XRED0, XRED1, XRED2, XRED3, . . . XREDk supplied from the redundant fuse circuit 26 have information of selecting any one of the redundant block selective lines Bb1, Bb2, Bb3, . . . Bbi. The redundant row address decode section 33 decodes the redundant address signals XRED0, XRED1, XRED2, XRED3, . . . XREDk into the redundant row address decode signals Db1, Db2, Db3, . . . Dbi, wherein a corresponding one of the redundant row address decode signals Db1, Db2, Db3, . . . Dbi to the selecting one of the redundant block selective lines Bb1, Bb2, Bb3, . . . Bbi is made by the redundant row address decode section 33 into a selecting level, whilst the remaining redundant row address decode signals are made into a non-selecting level. If the test mode signal TRED externally supplied is in the inactive level, then the redundant block selective line disable section 34 is operated to connect the redundant block selective lines Bb1, Bb2, Bb3, . . . Bbi into the redundant row address decode section 33 so as to permit transmissions of the redundant row address decode signals Db1, Db2, Db3, . . . Dbi onto the redundant block selective lines Bb1, Bb2, Bb3, . . . Bbi respectively. If the test mode signal TRED externally supplied is in the active level, then the redundant block selective line disable section 34 is operated to disconnect the redundant block selective lines Bb1, Bb2, Bb3, . . . Bbi from the redundant row address decode section 33 so that no signals are transmitted onto the redundant block selective lines Bb1, Bb2, Bb3, . . . Bbi.

The row address decode circuit 28 comprises a row address decode section 35 and a redundant block selective line enable section 36. The row address decode section 35 is connected to the row address circuit 25 for receiving the row address signals X0, X1, X2, X3 . . . Xj from the row address circuit 25 and subsequent decoding operations for decoding the row address signals X0, X1, X2, X3 . . . Xj into redundant row address decode signals Dc1, Dc2, Dc3, . . . Dci. The redundant block selective line enable section 36 receives the test mode signal TRED externally supplied. The redundant block selective line enable section 36 is also connected to the row address decode section 35 for receiving the redundant row address decode signals Dc1, Dc2, Dc3, . . . Dci from the row address decode section 35. The redundant block selective line enable section 36 is also connected to the redundant block selective lines Bb1, Bb2, Bb3, Bbi. The redundant row address decode signals Dc1, Dc2, Dc3, . . . Dci correspond to the redundant block selective lines Ba1, Ba2, Ba3, . . . Bah, respectively. The row address signals X0, X1, X2, X3 . . . Xj supplied from the row address circuit 25 have information of selecting any one of the redundant block selective lines Bb1, Bb2, Bb3, . . . Bbi. The row address decode section 35 decodes the row address signals X0, X1, X2, X3 . . . Xj into the redundant row address decode signals Dc1, Dc2, Dc3, . . . Dci, wherein a corresponding one of the redundant row address decode signals Dc1, Dc2, Dc3, . . . Dci to the selecting one of the redundant block selective lines Bb1, Bb2, Bb3, . . . Bbi is made by the row address decode section 35 into a selecting level, whilst the remaining redundant row address decode signals are made into a non-selecting level. If the test mode signal TRED externally supplied is in the inactive level, then the redundant block selective line enable section 36 is operated to disconnect the redundant block selective lines Bb1, Bb2, Bb3, . . . Bbi from the row address decode section 35 so that no signals are transmitted onto the redundant block selective lines Bb1, Bb2, Bb3, . . . Bbi. If the test mode signal TRED externally supplied is in the active level, then the redundant block selective line enable section 36 is operated to connect the redundant block selective lines Bb1, Bb2, Bb3, . . . Bbi into the row address decode section 35 so as to permit transmissions of the redundant row address decode signals Dc1, Dc2, Dc3, . . . Dci onto the redundant block selective lines Bb1, Bb2, Bb3, . . . Bbi respectively.

The redundant fuse circuit 26 is connected to the row address circuit 25 for receiving the row address signals X0, X1, X2, X3 . . . Xj from the row address circuit 25, so that the redundant fuse circuit 26 generates the redundant address signals XRED0, XRED1, XRED2, XRED3, . . . XREDk in accordance with the row address signals X0, X1, X2, X3 . . . Xj, wherein the redundant address signals XRED0, XRED1, XRED2, XRED3, . . . XREDk have informations of designating redundant addresses The redundant fuse circuit 26 has a plurality of fuses not illustrated. The row address signals X0, X1, X2, X3 . . . Xj from the row address circuit 25 provides a row address where a defective memory cell exists. The fuses in the redundant fuse circuit 26 have previously been disconnected to generate the redundant address signals XRED0, XRED1, XRED2, XRED3, . . . XREDk which designates a redundant address of a redundant memory cell to be used in place of the defective memory cell. This operations to disconnect the fuses will be described below.

The following descriptions will focus on the test in the manufacturing processes for the semiconductor memory device. After the diffusion process has been completed, then probes are bonded by pressure welding to electrodes of the semiconductor memory device. A power supply and a tester are also connected to the semiconductor memory device. The test to the semiconductor memory device may be divided into two tests, for example, the test to the normal memory cell array 21a and the test to the redundant memory cell array 21b. The descriptions will be made of the test to the normal memory cell array 21a prior to the descriptions of the test to the redundant memory cell array 21b.

The test to the normal memory cell array 21a may be made as follows. The word line selecting circuit 23a receives the row address signals X0, X1, X2, X3 . . . Xj from the row address circuit 25 so that the word line selecting circuit 23a is operated to sequentially select the word lines Wa1, Wa2, Wa3, . . . Wam. Since the row address signals X0, X1, X2, X3 . . . Xj do not designate the redundant word lines Wb1, Wb2, Wb3, . . . Wbn, the redundant word line selecting circuit 23b does not select the redundant word lines Wb1, Wb2, Wb3, . . . Wbn. Namely, the redundant word line selecting circuit 23b makes the redundant word lines Wb1, Wb2, Wb3, . . . Wbn into the non-selective level.

The redundant fuse circuit 26 at this stage has not yet carried out the disconnecting operation. This redundant fuse circuit 26 sets the redundant address signals XRED0, XRED2, XRED3, . . . XREDk into the non-selective level so as not to select the redundant word lines Wb1, Wb2, Wb3, . . . Wbn. The redundant fuse circuit 26 sets the redundant enable signal EN into the inactivated level. During the test to the normal memory cell array 21a, the test mode signal TRED remains in inactivated level which is supplied externally.

Since the redundant enable signal EN and the test mode signal TRED are in the inactivated level, then the block selective line disable section 32 is operated to connect the block selective lines Ba1, Ba2, Ba3, . . . Bah into the row address decode section 31 so as to permit transmissions of the row address decode signals Da1, Da2, Da3, . . . Dah onto the block selective lines Ba1, Ba2, Ba3, . . . Bah respectively. Further since the test mode signal TRED externally supplied is in the inactive level, then the redundant block selective line disable section 34 is operated to connect the redundant block selective lines Bb1, Bb2, Bb3, . . . Bbi into the redundant row address decode section 33 so as to permit transmissions of the redundant row address decode signals Db1, Db2, Db3, . . . Dbi onto the redundant block selective lines Bb1, Bb2, Bb3, . . . Bbi respectively. Furthermore since the test mode signal TRED externally supplied is in the inactive level, then the redundant block selective line enable section 36 is operated to disconnect the redundant block selective lines Bb1, Bb2, Bb3, . . . Bbi from the row address decode section 35 so that no signals are transmitted onto the redundant block selective lines Bb1, Bb2, Bb3, . . . Bbi.

Accordingly, the block selective line selecting circuit 24 is operated to place into the selecting level a corresponding one of the block selective lines Ba1, Ba2, Ba3, . . . Bah to the selecting one of the row address signals X0, X1, X2, X3 . . . Xj, whilst to place the remaining block selective lines into the non-selecting level. The redundant block selective line selecting circuit 27 and the row address decode circuit 28 are operated to place all of the redundant block selective lines Bb1, Bb2, Bb3, . . . Bbi into the non-selective level.

In the sub-word drivers 22a connected to the selected one of the word lines Wa1, Wa2, Wa3, . . . Wam, a selected one of the sub-word drivers 22a being connected to the selected one of the block selective lines Ba1, Ba2, Ba3, . . . Bah is activated to connect the sub-word line SWa to the selected one of the word lines Wa1, Wa2, Wa3, . . . Wam. In the sub-word drivers 22a connected to the selected one of the word lines Wa1, Wa2, Wa3, . . . Wam, the remaining sub-word drivers being connected to the remaining non-selected block selective lines are inactivated not to connect the sub-word line SWa to the word lines Wa1, Wa2, Wa3, . . . Wam. Further, the sub-word drivers 22a connected to the non-selected word lines are also inactivated not to connect the sub-word line SWa to the word lines Wa1, Wa2, Wa3, . . . Wam.

In the meantime, the semiconductor memory device also has a column address circuit not illustrated which generates column address signals to be transmitted to a digit line selective circuit not illustrated, so that the digit line selective circuit is operated to select any one of the digit lines.

Consequently, a predetermined test mode signal is written into and then read out a selected one of the normal memory cells Ma designated by both the selected one of the sub-word lines SWa and the selected one of the digit lines, so that any defective one of the normal memory cells Ma can be detected. If the currently tested one of the normal memory cells Ma is defective, then the address of the defective one of the normal memory cells Ma is stored into the tester. The above operations will be made to all of the normal memory cells Ma one by one.

The subsequent descriptions will focus on the test to the redundant memory cell array 21b. The test to the redundant memory cell array 21b may be made as follows. The redundant word line selecting circuit 23b receives the row address signals X0, X1, X2, X3 . . . Xj from the row address circuit 25 so that the redundant word line selecting circuit 23b is operated to sequentially select the redundant word lines Wb1, Wb2, Wb3, . . . Wbn. Since the row address signals X0, X1, X2, X3 . . . Xj do not designate the normal word lines Wa1, Wa2, Wa3, - Wam, the word line selecting circuit 23a does not select the word lines Wa1, Wa2, Wa3, . . . Wam. Namely, the word line selecting circuit 23a makes the word lines Wa1, Wa2, Wa3, . . . Wam into the non-selective level.

The redundant fuse circuit 26 at this stage has not yet carried out the disconnecting operation. This redundant fuse circuit 26 sets the redundant address signals XRED0, XRED1, XRED2, XRED3, . . . XREDk into the non-selective level so as not to select the redundant word lines Wb1, Wb2, Wb3, . . . Wbn. The redundant fuse circuit 26 sets the redundant enable signal EN into the inactivated level. During the test to the redundant memory cell array 21b, the test mode signal TRED remains in activated level which is supplied externally.

Since the redundant enable signal EN is in the inactivated level whilst the test mode signal TRED is in the activated level, then the block selective line disable section 32 is operated to disconnect the block selective lines Ba1, Ba2, Ba3, . . . Bah from the row address decode section 31 so as to inhibit transmissions of the row address decode signals Da1, Da2, Da3, . . . Dah onto the block selective lines Ba1, Ba2, Ba3, . . . Bah. Further since the test mode signal TRED externally supplied is in the active level, then the redundant block selective line disable section 34 is operated to disconnect the redundant block selective lines Bb1, Bb2, Bb3, . . . Bbi from the redundant row address decode section 33 so as to inhibit transmissions of the redundant row address decode signals Db1, Db2, Db3, . . . Dbi onto the redundant block selective lines Bb1, Bb2, Bb3, . . . Bbi. Furthermore since the test mode signal TRED externally supplied is in the active level, then the redundant block selective line enable section 36 is operated to connect the redundant block selective lines Bb1, Bb2, Bb3, . . . Bbi into the row address decode section 35 so that the redundant block selective line enable section 36 is operated to connect the redundant block selective lines Bb1, Bb2, Bb3, . . . Bbi into the row address decode section 35 so as to permit transmissions of the redundant row address decode signals Dc1, Dc2, Dc3, . . . Dci onto the redundant block selective lines Bb1, Bb2, Bb3, . . . Bbi respectively.

Accordingly, the block selective line selecting circuit 24 is operated to place into the non-selecting level all of the block selective lines Ba1, Ba2, Ba3, . . . Bah. The redundant block selective line selecting circuit 27 is operated to place into the non-selecting level all of the redundant block selective lines Bb1, Bb2, Bb3, . . . Bbi. The row address decode circuit 28 is operated to place into a selective level a corresponding one of the redundant block selective lines Bb1, Bb2, Bb3, . . . Bbi to the selecting one of the row address signals X0, X1, X2, X3 . . . Xj, whilst to place the remaining redundant block selective lines into the non-selecting level.

In the redundant sub-word drivers 22b connected to the selected one of the redundant word lines Wb1, Wb2, Wb3, . . . Wbn, a selected one of the redundant sub-word drivers 22b being connected to the selected one of the redundant block selective lines Bb1, Bb2, Bb3, . . . Bbi is activated to connect the redundant sub-word line SWb to the selected one of the redundant word lines Wb1, Wb2, Wb3, . . . Wbn. In the redundant sub-word drivers 22b connected to the selected one of the redundant word lines Wb1, Wb2, Wb3, . . . Wbn, the remaining redundant sub-word drivers being connected to the remaining non-selected redundant block selective lines are inactivated not to connect the redundant sub-word line SWb to the redundant word lines Wb1, Wb2, Wb3, . . . Wbn. Further, the redundant sub-word drivers 22b connected to the non-selected redundant word lines are also inactivated not to connect the redundant sub-word line SWb to the redundant word lines Wb1, Wb2, Wb3, . . . Wbn.

In the meantime, the column address circuit not illustrated generates the column address signals to be transmitted to a digit line selective circuit not illustrated, so that the digit line selective circuit is operated to select any one of the digit lines.

Consequently, a predetermined test mode signal is written into and then read out a selected one of the redundant memory cells Mb designated by both the selected one of the redundant sub-word lines SWb and the selected one of the digit lines, so that any defective one of the redundant memory cells Mb can be detected. If the currently tested one of the redundant memory cells Mb is defective, then the address of the defective one of the redundant memory cells Mb is stored into the tester. The above operations will be made to all of the redundant memory cells Mb one by one.

After the tests have been completed, then it is confirmed whether or not it is possible to replace the defective memory cells in the normal memory cell array 21a by non-defective redundant memory cells in the redundant memory cell arrays 21b. If possible, data are prepared of the numbers of the fuses corresponding to the row addresses which designate the defective memory cells.

In the normal mode, the row address of the defective memory cell is designated by the row address signals X0, X1, X2, X3 . . . Xj, wherein the row address signals X0, X1, X2, X3 . . . Xj from the row address circuit 25 provides the row address where the defective memory cell exists. The fuses in the redundant fuse circuit 26 are so disconnected by the trimmer machine in accordance with the address data as to generate the redundant address signals XRED0, XRED1, XRED2, XRED3, . . . XREDk which designate the redundant address of the non-defective redundant memory cell to be used in place of the defective memory cell.

The following descriptions will be concerned with the operations of the semiconductor memory device in the normal mode in case when the non-defective normal memory cells are selected, assuming that the defective memory cell exists at the row address "3" in the normal memory cell array 21a whilst the row address "1" is entered to be selected, provided the column address is optional. The row address "3" is given by the row address signals X0=high level, X1=high level, X2=low level, X3=low level . . . Xj=low level. The row address "1" is given by the row address signals X0=high level, X1=low level, X2=low level, X3=low level . . . Xj=low level.

The word line selective circuit 23a is operated to select one of the word lines Wa1, Wa2, Wa3, . . . Wam in accordance with the row address signals X0, X1, X2, X3 . . . Xj.

When the row address signals X0, X1, X2, X3 . . . Xj not designating the defective memory cell are entered, then the redundant fuse circuit 26 is operated to set the redundant address signals XRED0, XRED1, XRED2, XRED3, . . . XREDk into the non-selective level so as not to designate the redundant word lines Wb1, Wb2, Wb3, . . . Wbn and also set the redundant enable signal EN into the inactivated level.

In the normal mode, the test mode signal TRED externally supplied remains in the inactivated level.

Since the redundant enable signal EN and the test mode signal TRED are in the inactivated level, then the block selective line disable section 32 is operated to connect the block selective lines Ba1, Ba2, Ba3, . . . Bah into the row address decode section 31 so as to permit transmissions of the row address decode signals Da1, Da2, Da3, . . . Dah onto the block selective lines Ba1, Ba2, Ba3, . . . Bah respectively. Further since the test mode signal TRED externally supplied is in the inactive level, then the redundant block selective line disable section 34 is operated to disconnect the redundant block selective lines Bb1, Bb2, Bb3, . . . Bbi from the redundant row address decode section 33 so as to inhibit transmissions of the redundant row address decode signals Db1, Db2, Db3, . . . Dbi onto the redundant block selective lines Bb1, Bb2, Bb3, . . . Bbi. Furthermore since the test mode signal TRED externally supplied is in the inactive level, then the redundant block selective line enable section 36 is operated to disconnect the redundant block selective lines Bb1, Bb2, Bb3, . . . Bbi from the row address decode section 35 so that no signals are transmitted onto the redundant block selective lines Bb1, Bb2, Bb3, . . . Bbi.

Accordingly, the block selective line selecting circuit 24 is operated to place into the selecting level a corresponding one of the block selective lines Ba1, Ba2, Ba3, . . . Bah to the selecting one of the row address signals X0, X1, X2, X3 . . . Xj, whilst to place the remaining block selective lines into the non-selecting level. The redundant block selective line selecting circuit 27 and the row address decode circuit 28 are operated to place all of the redundant block selective lines Bb1, Bb2, Bb3, . . . Bbi into the non-selective level.

In the sub-word drivers 22a connected to the selected one of the word lines Wa1, Wa2, Wa3, . . . Wam, a selected one of the sub-word drivers 22a being connected to the selected one of the block selective lines Ba1, Ba2, Ba3, . . . Bah is activated to connect the sub-word line SWa to the selected one of the word lines Wa1, Wa2, Wa3, . . . Wam. In the sub-word drivers 22a connected to the selected one of the word lines Wa1, Wa2, Wa3, . . . Wam, the remaining sub-word drivers being connected to the remaining non-selected block selective lines are inactivated not to connect the sub-word line SWa to the word lines Wa1, Wa2, Wa3, . . . Wam. Further, the sub-word drivers 22a connected to the non-selected word lines are also inactivated not to connect the sub-word line SWa to the word lines Wa1, Wa2, Wa3, . . . Wam. Furthermore, the redundant sub-word drivers 22b are also inactivated not to connect the redundant sub-word line SWb to the redundant word lines Wb1, Wb2, Wb3, . . . Wbm.

In the meantime, the column address signals are transmitted to a digit line selective circuit not illustrated, so that the digit line selective circuit is operated to select any one of the digit lines.

Consequently, a real datum is written into and then read out a selected one of the normal memory cells Ma designated by both the selected one of the sub-word lines SWa and the selected one of the digit lines.

The following descriptions will be concerned with the other operations of the semiconductor memory device in the normal mode in case when the non-defective normal memory cells are selected, assuming that the defective memory cell exists at the row address "3" in the normal memory cell array 21a and this address "3" is entered to be selected, provided the column address is optional. The row address "3" is given by the row address signals X0=high level, X1=high level, X2=low level, X3=low level . . . Xj=low level.

When the row address signals X0, X1, X2, X3 . . . Xj designating the defective memory cell are entered, then the redundant fuse circuit 26 is operated to set the redundant address signals XRED0, XRED1, XRED2, XRED3, . . . XREDk so as to designate the redundant word lines Wb1, Wb2, Wb3, . . . Wbn and also set the redundant enable signal EN into the activated level, so that the redundant word selective line selecting circuit 23b is operated to select one of the redundant word lines Wb1, Wb2, Wb3, . . . Wbn in accordance with the row address signals X0, X1, X2, X3 . . . Xj.

In the normal mode, the test mode signal TRED externally supplied remains in the inactivated level.

Since the redundant enable signal EN is in the activated level, then the block selective line disable section 32 is operated to disconnect the block selective lines Ba1, Ba2, Ba3, . . . Bah from the row address decode section 31 so as to inhibit transmissions of the row address decode signals Da1, Da2, Da3, . . . Dah onto the block selective lines Ba1, Ba2, Ba3, . . . Bah respectively. Further since the test mode signal TRED externally supplied is in the inactivated level, then the redundant block selective line disable section 34 is operated to connect the redundant block selective lines Bb1, Bb2, Bb3, . . . Bbi to the redundant row address decode section 33 so as to permit transmissions of the redundant row address decode signals Db1, Db2, Db3, . . . Dbi onto the redundant block selective lines Bb1, Bb2, Bb3, . . . Bbi. Furthermore since the test mode signal TRED externally supplied is in the inactive level, then the redundant block selective line enable section 36 is operated to disconnect the redundant block selective lines Bb1, Bb2, Bb3, . . . Bbi from the row address decode section 35 so that no signals are transmitted onto the redundant block selective lines Bb1, Bb2, Bb3, . . . Bbi.

Accordingly, the block selective line selecting circuit 24 is operated to place all of the block selective lines Ba1, Ba2, Ba3, . . . Bah. The redundant block selective line selecting circuit 27 is operated to place into the selecting level a corresponding one of the redundant block selective lines Bb1, Bb2, Bb3, . . . Bbi to the selecting one of the redundant row address signals XRED0, XRED1, XRED2, XRED3 . . . . XREDk, whilst to place the remaining redundant block selective lines into the non-selecting level. The row address decode circuit 28 is operated to place all of the redundant block selective lines Bb1, Bb2, Bb3, . . . Bbi into the nonselective level.

In the redundant sub-word drivers 22b connected to the selected one of the redundant word lines Wb1, Wb2, Wb3, . . . Wbm, a selected one of the redundant sub-word drivers 22b being connected to the selected one of the redundant block selective lines Bb1, Bb2, Bb3, . . . Bbi is activated to connect the redundant sub-word line SWb to the selected one of the redundant word lines Wb1, Wb2, Wb3, . . . Wbn. In the redundant sub-word drivers 22b connected to the selected one of the redundant word lines Wb1, Wb2, Wb3, . . . Wbn, the remaining redundant sub-word drivers being connected to the remaining non-selected block selective lines are inactivated not to connect the redundant sub-word line SWb to the redundant word lines Wb1, Wb2, Wb3, . . . Wbm. Further, the redundant sub-word drivers 22b connected to the non-selected redundant word lines are also inactivated not to connect the sub-word line SWa to the word lines Wa1, Wa2, Wa3, . . . Wam. Furthermore, the redundant sub-word drivers 22b are also inactivated not to connect the redundant sub-word line SWb to the redundant word lines Wb1, Wb2, Wb3, . . . Wbm.

In the meantime, the column address signals are transmitted to a digit line selective circuit not illustrated, so that the digit line selective circuit is operated to select any one of the digit lines.

Consequently, a real datum is written into and then read out a selected one of the redundant memory cells Mb designated by both the selected one of the redundant sub-word lines SWb and the selected one of the digit lines.

The above conventional semiconductor memory device requires both the block selective line selecting circuit for selecting the block selective lines connected to the normal memory cell blocks in the normal memory cell arrays and the redundant block selective line selecting circuit for selecting the redundant block selective lines connected to the redundant memory cell blocks in the redundant memory cell arrays. This makes it difficult to reduce the scale of the circuits of the semiconductor memory device. This further makes it difficult to reduce the area of the chip having the semiconductor memory device.

Further, the above conventional semiconductor memory device requires the row address decode circuit for conducting the test to the redundant memory cell array. This also makes it difficult to reduce the scale of the circuits of the semiconductor memory device. This further makes it difficult to reduce the area of the chip having the semiconductor memory device.

In the above circumstances, it had been required to develop a novel scaled-down circuitry for selecting block selective lines connected to normal and redundant memory cell blocks in the normal and redundant memory cell arrays respectively in a semiconductor memory device.

SUMMARY OF THE INVENTION

Accordingly, it is an object of the present invention to provide a semiconductor memory device free from the above problems.

It is a further object of the present invention to provide a novel scaled-down circuitry for selecting block selective lines connected to normal and redundant memory cell blocks in the normal and redundant memory cell arrays respectively in a semiconductor memory device.

It is a still further object of the present invention to provide a novel semiconductor memory device having a scaled-down circuitry for selecting block selective lines connected to normal and redundant memory cell blocks in the normal and redundant memory cell arrays respectively.

The present invention provides a semiconductor memory device having a block selective line selecting circuit connected to a plurality of block selective common lines, each of which is commonly connected to both corresponding normal and redundant memory cell blocks in normal and redundant memory cell arrays, wherein the block selective line selecting circuit is switched into a first state to permit transmissions of decoded normal row address signals having informations of designating a normal row address to which a normal memory cell to be selected belongs when a non-defective normal memory cell is selected in the normal memory cell array, and also the block selective line selecting circuit is switched into a second state to permit transmissions of decoded redundant row address signals having informations of designating a redundant row address to which a redundant memory cell to be selected belongs when a defective normal memory cell is selected in the normal memory cell array.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DESCRIPTION OF THE PREFERRED EMBODIMENTS

Figure 1:
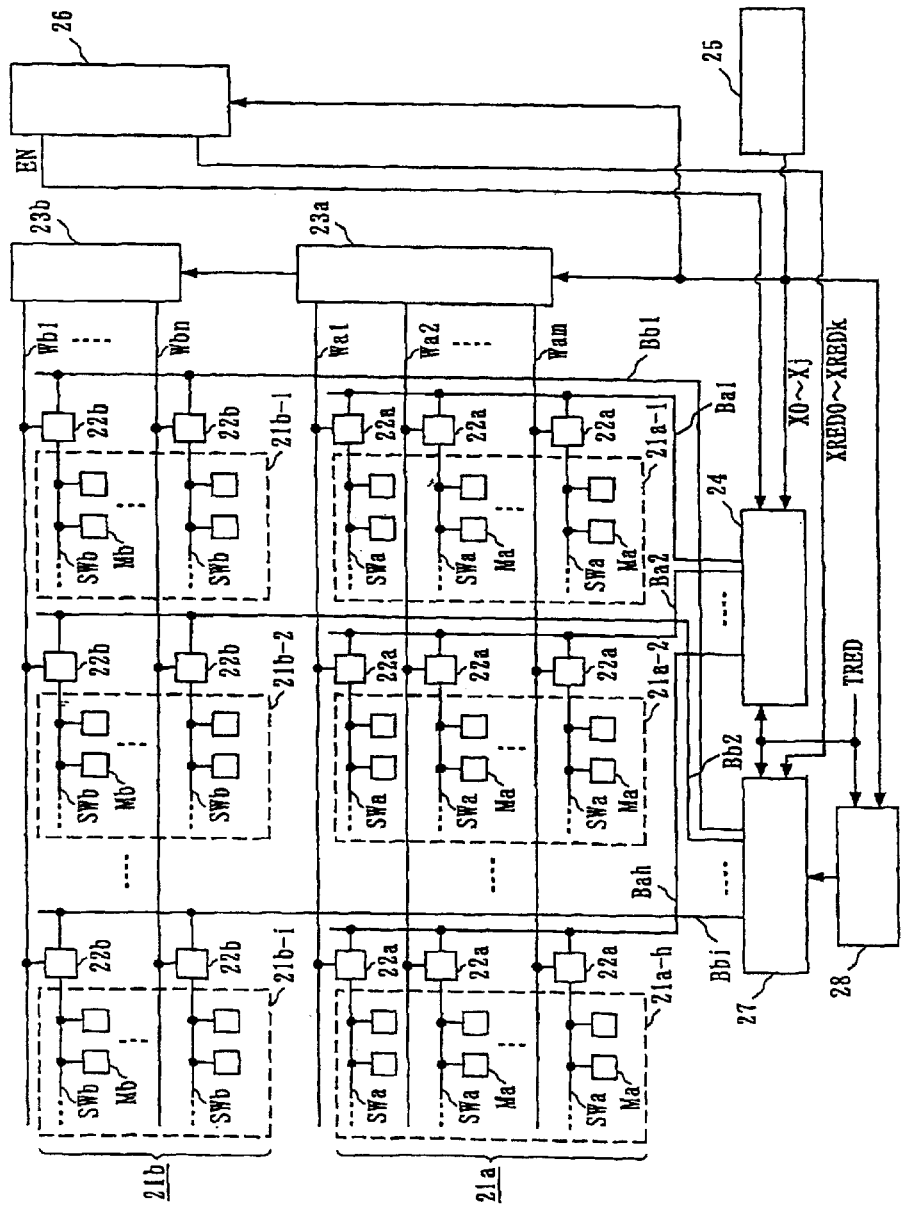
FIG. 1 is a block diagram illustrative of a conventional divided-word semiconductor memory device with redundant memory cell arrays for remedy of defective memory cells in normal memory cell arrays.
Figure 2:
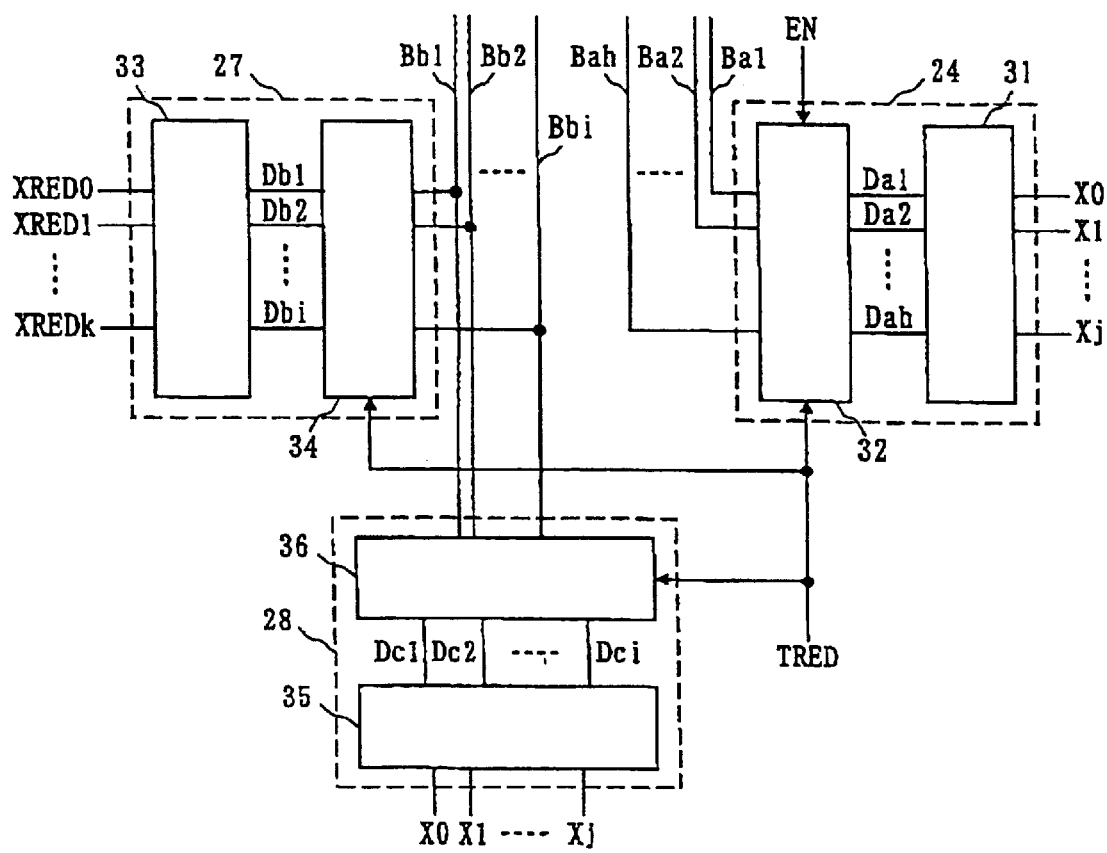
FIG. 2 is a block diagram illustrative of circuit configurations of the block selective line selecting circuit, the redundant block selective line selecting circuit, and the row address decoder circuit in the conventional divided-word semiconductor memory device with redundant memory cell arrays in FIG. 1.

The first aspect of the present invention provides a semiconductor memory device having a block selective line structure comprising a plurality of block selective common lines, each of which is commonly connected to both corresponding normal and redundant memory cell blocks in normal and redundant memory cell arrays.

It is preferable that the plurality of block selective common lines are connected to a block selective line selecting circuit, which is operated to select first one of the plurality of block selective common lines when a non-defective normal memory cell belonging to the first one of the plurality of block selective common lines is selected in the normal memory cell array, and also which is operated to select second one of the plurality of block selective common lines when a defective normal memory cell belonging to the second one of the plurality of block selective common lines is selected in the normal memory cell array.

It is further preferable that the block selective line selecting circuit is switched into a first state to permit transmissions of decoded normal row address signals having informations of designating a normal row address to which a normal memory cell to be selected belongs when the non-defective normal memory cell is selected, and also switched into a second state to permit transmissions of decoded redundant row address signals having informations of designating a redundant row address to which a redundant memory cell to be selected belongs when the defective normal memory cell is selected.

It is furthermore preferable that the block selective line selecting circuit comprises: a normal row address decode section for decoding normal row address signals; a redundant row address decode section for decoding redundant row address signals; a switching section connected to the normal and redundant row address decode sections and also connected to the block selective common lines; and a controller connected to the switching section for controlling switching operations of the switching section so as to permit transmissions of the decoded normal row address signals when the non-defective normal memory cell is selected, and also to permit transmissions of the decoded redundant row address signals when the defective normal memory cell is selected.

It is also preferable that each of the block selective common lines is also connected through normal and redundant memory cell block switching elements to normal and redundant memory cells in the normal and redundant memory cell blocks respectively belonging to the each common block line selective line, and the normal memory cell block switching elements are connected through normal word lines to a normal word line selecting circuit which is operated to select one of the normal word lines when the non-defective normal memory cell is selected, and also which is operated not to select any of the normal word lines when the defective normal memory cell is selected, and the redundant memory cell block switching elements are connected through redundant word lines to a redundant word line selecting circuit which is operated to select one of the redundant word lines when the defective normal memory cell is selected, and also which is operated not to select any of the redundant word lines when the non-defective normal memory cell is selected.

It is further preferable that the normal word line selecting circuit is connected to a row address circuit for receiving normal row address signals having informations of designating a normal row address to which a normal memory cell to be selected belongs, and the redundant word line selecting circuit is connected to a redundant fuse circuit for receiving the redundant address signals having informations of designating a redundant row address to which a redundant memory cell to be selected belongs.

It is furthermore preferable that the normal word line selecting circuit is connected to the redundant word line selecting circuit for receiving a redundant enable signal.

The second aspect of the present invention provides a semiconductor memory device having a block selective line selecting circuit connected to a plurality of block selective common lines, each of which is commonly connected to both corresponding normal and redundant memory cell blocks in normal and redundant memory cell arrays, wherein the block selective line selecting circuit is switched into a first state to permit transmissions of decoded normal row address signals having informations of designating a normal row address to which a normal memory cell to be selected belongs when a non-defective normal memory cell is selected in the normal memory cell array, and also the block selective line selecting circuit is switched into a second state to permit transmissions of decoded redundant row address signals having informations of designating a redundant row address to which a redundant memory cell to be selected belongs when a defective normal memory cell is selected in the normal memory cell array.

It is preferable that the block selective line selecting circuit comprises: a normal row address decode section for decoding normal row address signals; a redundant row address decode section for decoding redundant row address signals; a switching section connected to the normal and redundant row address decode sections and also connected to the block selective common lines; and a controller connected to the switching section for controlling switching operations of the switching section so as to permit transmissions of the decoded normal row address signals when the non-defective normal memory cell is selected, and also to permit transmissions of the decoded redundant row address signals when the defective normal memory cell is selected.

It is also preferable that each of the block selective common lines is also connected through normal and redundant memory cell block switching elements to normal and redundant memory cells in the normal and redundant memory cell blocks respectively belonging to the each common block line selective line, and the normal memory cell block switching elements are connected through normal word lines to a normal word line selecting circuit which is operated to select one of the normal word lines when the non-defective normal memory cell is selected, and also which is operated not to select any of the normal word lines when the defective normal memory cell is selected, and the redundant memory cell block switching elements are connected through redundant word lines to a redundant word line selecting circuit which is operated to select one of the redundant word lines when the defective normal memory cell is selected, and also which is operated not to select any of the redundant word lines when the non-defective normal memory cell is selected It is further preferable that the normal word line selecting circuit is connected to a row address circuit for receiving normal row address signals having informations of designating a normal row address to which a normal memory cell to be selected belongs, and the redundant word line selecting circuit is connected to a redundant fuse circuit for receiving the redundant address signals having informations of designating a redundant row address to which a redundant memory cell to be selected belongs.

It is furthermore preferable that the normal word line selecting circuit is connected to the redundant word line selecting circuit for receiving a redundant enable signal.

The third aspect of the present invention provides a semiconductor memory device having a block selective line selecting circuit comprises: a normal row address decode section for decoding normal row address signals; a redundant row address decode section for decoding redundant row address signals; a switching section connected to the normal and redundant row address decode sections and also connected to connected to a plurality of block selective lines; and a controller connected to the switching section for controlling switching operations of the switching section so that the switching section is switched into a first state to permit transmissions of decoded normal row address signals having informations of designating a normal row address to which a normal memory cell to be selected belongs when a non-defective normal memory cell is selected in the normal memory cell array, and also the switching section is switched into a second state to permit transmissions of decoded redundant row address signals having informations of designating a redundant row address to which a redundant memory cell to be selected belongs when a defective normal memory cell is selected in the normal memory cell array.

It is preferable that each of the block selective lines comprises a block selective common line commonly connected to both corresponding normal and redundant memory cell blocks in normal and redundant memory cell arrays.

It is further preferable that each of the block selective common lines is also connected through normal and redundant memory cell block switching elements to normal and redundant memory cells in the normal and redundant memory cell blocks respectively belonging to the each common block line selective line, and the normal memory cell block switching elements are connected through normal word lines to a normal word line selecting circuit which is operated to select one of the normal word lines when the non-defective normal memory cell is selected, and also which is operated not to select any of the normal word lines when the defective normal memory cell is selected, and the redundant memory cell block switching elements are connected through redundant word lines to a redundant word line selecting circuit which is operated to select one of the redundant word lines when the defective normal memory cell is selected, and also which is operated not to select any of the redundant word lines when the non-defective normal memory cell is selected.

It is further preferable that the normal word line selecting circuit is connected to a row address circuit for receiving normal row address signals having informations of designating a normal row address to which a normal memory cell to be selected belongs, and the redundant word line selecting circuit is connected to a redundant fuse circuit for receiving the redundant address signals having informations of designating a redundant row address to which a redundant memory cell to be selected belongs.

It is furthermore preferable that the normal word line selecting circuit is connected to the redundant word line selecting circuit for receiving a redundant enable signal.

The fourth aspect of the present invention provides a semiconductor memory device having a word selecting circuitry comprising: a normal word line selecting circuit and a redundant word line selecting circuit. The normal word line selecting circuit is connected to a row address circuit for receiving normal row address signals having informations of designating a normal row address to which a normal memory cell to be selected belongs, and also the normal word line selecting circuit is connected to a plurality of normal word lines for selecting one of the normal word lines in accordance with the normal row address signals when a non-defective normal memory cell is selected, and also selecting none of the normal word lines when the defective normal memory cell is selected. The redundant word line selecting circuit is connected to a redundant fuse circuit for receiving redundant address signals having informations of designating a redundant row address to which a redundant memory cell to be selected belongs, and also the redundant word line selecting circuit is connected to a plurality of redundant word lines for selecting one of the redundant word lines in accordance with the redundant row address signals when the defective normal memory cell is selected, and also selecting none of the redundant word lines when the non-defective normal memory cell is selected.

It is preferable that the normal word line selecting circuit is connected to the redundant word line selecting circuit for receiving a redundant enable signal.

The fifth aspect of the present invention provides a semiconductor memory device having a block selective line selecting circuit connected to a plurality of block selective common lines, a normal word line selecting circuit, and a redundant word line selecting circuit, wherein each of the plurality of block selective common lines is commonly connected to both corresponding normal and redundant memory cell blocks in normal and redundant memory cell arrays, and wherein the block selective line selecting circuit is switched into a first state to permit transmissions of decoded normal row address signals having informations of designating a normal row address to which a normal memory cell to be selected belongs when a non-defective normal memory cell is selected in the normal memory cell array, and also the block selective line selecting circuit is switched into a second state to permit transmissions of decoded redundant row address signals having informations of designating a redundant row address to which a redundant memory cell to be selected belongs when a defective normal memory cell is selected in the normal memory cell array; and wherein the normal word line selecting circuit is connected to a row address circuit for receiving normal row address signals having informations of designating a normal row address to which a normal memory cell to be selected belongs, and also the normal word line selecting circuit connected to a plurality of normal word lines for selecting one of the normal word lines in accordance with the normal row address signals when a non-defective normal memory cell is selected, and also selecting none of the normal word lines when the defective normal memory cell is selected; and wherein the redundant word line selecting circuit being connected to a redundant fuse circuit for receiving redundant address signals having informations of designating a redundant row address to which a redundant memory cell to be selected belongs, and also the redundant word line selecting circuit connected to a plurality of redundant word lines for selecting one of the redundant word lines in accordance with the redundant row address signals when the defective normal memory cell is selected, and also selecting none of the redundant word lines when the non-defective normal memory cell is selected It is preferable that the block selective line selecting circuit comprises: a normal row address decode section for decoding normal row address signals; a redundant row address decode section for decoding redundant row address signals; a switching section connected to the normal and redundant row address decode sections and also connected to the block selective common lines; and a controller connected to the switching section for controlling switching operations of the switching section so as to permit transmissions of the decoded normal row address signals when the non-defective normal memory cell is selected, and also to permit transmissions of the decoded redundant row address signals when the defective normal memory cell is selected.

It is further preferable that the normal word line selecting circuit is connected to a row address circuit for receiving normal row address signals having informations of designating a normal row address to which a normal memory cell to be selected belongs, and the redundant word line selecting circuit is connected to a redundant fuse circuit for receiving the redundant address signals having informations of designating a redundant row address to which a redundant memory cell to be selected belongs.

It is furthermore preferable that the normal word line selecting circuit is connected to the redundant word line selecting circuit for receiving a redundant enable signal.

FIRST EMBODIMENT

A first embodiment according to the present invention will be described in detail with reference to FIG. 3 which is a block diagram illustrative of a novel divided-word semiconductor memory device with redundant memory cell arrays for remedy of defective memory cells in normal memory cell arrays.

The semiconductor memory device has a memory cell array having memory cells aligned in a matrix. This memory cell array comprises a normal memory cell array 1a having normal memory cells Ma aligned in a matrix and a redundant memory cell array 1b having redundant memory cells Mb aligned in a matrix.

The normal memory cell array 1a comprises memory blocks 1a-1, 1a-2, 1a-3, . . . 1a-i, which are aligned in a row direction, wherein each memory block extends in a longitudinal direction parallel to a column direction. The redundant memory cell array 1b comprises redundant memory blocks 1b-1, 1b-2, 1b-3, . . . 1b-i, which are aligned in a row direction, wherein each redundant memory block extends in a longitudinal direction parallel to a column direction. Respective pairs of the memory blocks 1a-1, 1a-2, 1a-3, . . . . 1a-i and the redundant memory blocks 1b-1, 1b-2, 1b-3, . . . 1b-i correspond to block selective common lines B1, B2, B3, . . . Bi respectively, wherein the memory blocks 1a-1, 1a-2, 1a-3, . . . 1a-h and the redundant memory blocks 1b-1, 1b-2, 1b-3, . . . 1b-i are connected with to the block selective common lines Bi, B2, B3, . . . Bi respectively.

The semiconductor memory device also has word lines Wa1, Wa2, Wa3, . . . Wam which are allocated to the normal memory cells Ma in the normal memory cell array 1a and redundant word lines Wb1, Wb2, Wb3, . . . Wbn which are allocated to the redundant memory cells Mb in the redundant memory cell array 1b. The individual word lines Wa1, Wa2, Wa3 . . . Wam have corresponding sub-word lines SWa respectively so that the normal memory cells Ma are directly connected with the sub-word lines SWa. The individual redundant word lines Wb1, Wb2, Wb3, . . . Wbn have corresponding redundant sub-word lines SWb respectively so that the redundant memory cells Mb are directly connected with to the redundant sub-word lines SWb.

The normal memory cell array 1a further has sub-word drivers 2a corresponding to the individual sub-word lines SWa, so that the individual sub-word lines SWa are connected with the corresponding sub-word drivers 2a. The sub-word drivers 2a are respectively connected with the word lines Wa1, Wa2, Wa3, . . . Wam corresponding to the sub-word lines SWa, with which the sub-word drivers 2a are connected, whereby the individual sub-word lines SWa are connected through the sub-word drivers 2a to the corresponding word lines Wa1, Wa2, Wa3, . . . Wam. Further, the individual sub-word drivers 2a are connected with the block selective common lines b1, b2, b3, . . . bi corresponding to the individual memory blocks 1a-1, 1a-2, 1a-3, . . . 1a-i having the sub-word lines SWa connected with the sub-word drivers 2a, so that the individual sub-word lines SWa are connected through the sub-word drivers 2a to the block selective common lines b1, b2, b3, . . . bi. Namely, the individual sub-word lines SWa are connected through the sub-word drivers 2a both to the corresponding block selective common lines b1, b2, b3, . . . bi and to the corresponding word lines Wa1, Wa2, Wa3, . . . Wam.

The redundant memory cell array 1b further has redundant sub-word drivers 2b corresponding to the individual redundant sub-word lines SWb, so that the individual redundant sub-word lines SWb are connected with the corresponding redundant sub-word drivers 2b. The redundant sub-word drivers 2b are respectively connected with the redundant word lines Wb1, Wb2, Wb3, . . . Wbn corresponding to the redundant sub-word lines SWb, with which the redundant sub-word drivers 2b are connected, whereby the individual redundant sub-word lines SWb are connected through the redundant sub-word drivers 2b to the corresponding redundant word lines Wb1, Wb2, Wb3, . . . Wbn. Further, the individual redundant sub-word drivers 2b are connected with the block selective common lines b1, b2, b3, . . . bi corresponding to the individual redundant memory blocks 1b-1, 1b-2, 1b-3, . . . 1b-i having the redundant sub-word lines SWb connected with the redundant sub-word drivers 2b, so that the individual redundant sub-word lines SWb are connected through the redundant sub-word drivers 2b to the block selective common lines b1, b2, b3, . . . bi. Namely, the individual redundant sub-word lines SWb are connected through the redundant sub-word drivers 2b both to the corresponding block selective common lines b1, b2, b3, . . . bi and to the corresponding redundant word lines Wb1, Wb2, Wb3, . . . Wbn.

The semiconductor memory device further has digit lines which are connected to the normal memory cells Ma and the redundant memory cells Mb, so that digital signals are transmitted on the digit lines, whereby the digital signals are written into the normal memory cells Ma or the redundant memory cells Mb and also the digital signals are read out from the normal memory cells Ma or the redundant memory cells Mb.

The above normal word lines Wa1, Wa2, Wa3, . . . War and the redundant word lines Wb1, Wb2, Wb3, . . . Wbn extend in the row direction, whilst the block selective common lines b1, b2, b3, . . . bi extend in the column direction The sub-word drivers 2a are positioned near crossing points of the normal word lines Wa1, Wa2, Wa3, . . . Wan and the block selective common lines b1, b2, b3, . . . bi, so that the sub-word drivers 2a are connected both with the normal word lines Wa1, Wa2, Wa3, Wam and with the block selective common lines b1, b2, b3, . . . bi. The redundant sub-word drivers 2b are positioned near crossing points of the redundant word lines Wb1, Wb2, Wb3, . . . Wbn and the block selective common lines b1, b2, b3, . . . bi, so that the redundant sub-word drivers 2b are connected both with the redundant word lines Wb1, Wb2, Wb3, . . . Wbn and with the block selective common lines b1, b2, b3, . . . bi.

If one of the normal word lines Wa1, Wa2, Wa3, . . . Wam and one of the block selective common lines b1, b2, b3, . . . bi are respectively selected, then the sub-word driver 2a positioned near a crossing point of the selected word line and the selected block selective line is operated to connect the corresponding sub-word line SWa to the selected word line so as to drive all of the normal memory cells Ma directly connected with the sub-word driver 2a.

If one of the redundant word lines Wb1, Wb2, Wb3, . . . Wbn and one of the block selective common lines b1, b2, b3, . . . bi are respectively selected, then the redundant sub-word driver 2b positioned near a crossing point of the selected redundant word line and the selected redundant block selective line is operated to connect the corresponding redundant sub-word line SWb to the selected redundant word line so as to drive all of the redundant memory cells Mb directly connected with the redundant sub-word driver 2b.

The semiconductor memory device has a row address circuit 5 which generates row address signals X0, X1, X2, X3 . . . Xj. The semiconductor memory device also has a word line selective circuit 3a which is connected to the row address circuit 5 for receiving the row address signals X0, X1, X2, X3 . . . Xj from the row address circuit 5 so that the word line selective circuit 3a is operated to select any one of the word lines Wa1, Wa2, Wa3, . . . Wam in accordance with the row address signals X0, X1, X2, X3 . . . Xj. The semiconductor memory device has a redundant fuse circuit 6 which receives a test mode signal TRED and also is connected to the row address circuit 5 for receiving the row address signals X0, X1, X2, X3 . . . Xj from the row address circuit 5 so that the redundant fuse circuit 6 generates redundant address signals XRED0, XRED1, XRED2, XRED3, . . . XREDk in accordance with the row address signals X0, X1, X2, X3 . . . Xj. The semiconductor memory device also has a redundant word line selective circuit 3b which is connected to the redundant fuse circuit 6 for receiving the redundant address signals XRED0, XRED1, XRED2, XRED3, . . . XREDk from the redundant fuse circuit 6 so that the redundant word line selective circuit 3b is operated to select any one of the redundant word lines Wb1, Wb2, Wb3, . . . Wbm in accordance with the redundant address signals XRED0, XRED1, XRED2, XRED3, . . . XREDk The semiconductor memory device also has a block selective line selecting circuit 4 which is connected to the row address circuit 5 for receiving the row address signals X0, X1, X2, X3 . . . Xj from the row address circuit 5. The block selective line selecting circuit 4 is also connected to the redundant fuse circuit 6 for receiving the redundant address signals XRED0, XRED1, XRED2, XRED3, . . . XREDk from the redundant fuse circuit 6. The block selective line selecting circuit 4 is also connected to the redundant word line selective circuit 3b for receiving a redundant enable signal EN from the redundant word line selective circuit 3b. The block selective line selecting circuit 4 also receives the test mode signal TRED externally supplied. The block selective line selecting circuit 4 is operated to select any one of the block selective common lines b1, b2, b3, . .

. bi in accordance with the row address signals X0, X1, X2, X3 . . . Xj, the redundant enable signal EN, the redundant address signals XRED0, XRED1, XRED2, XRED3, . . . XREDk, and the test mode signal TRED.

Figure 3:
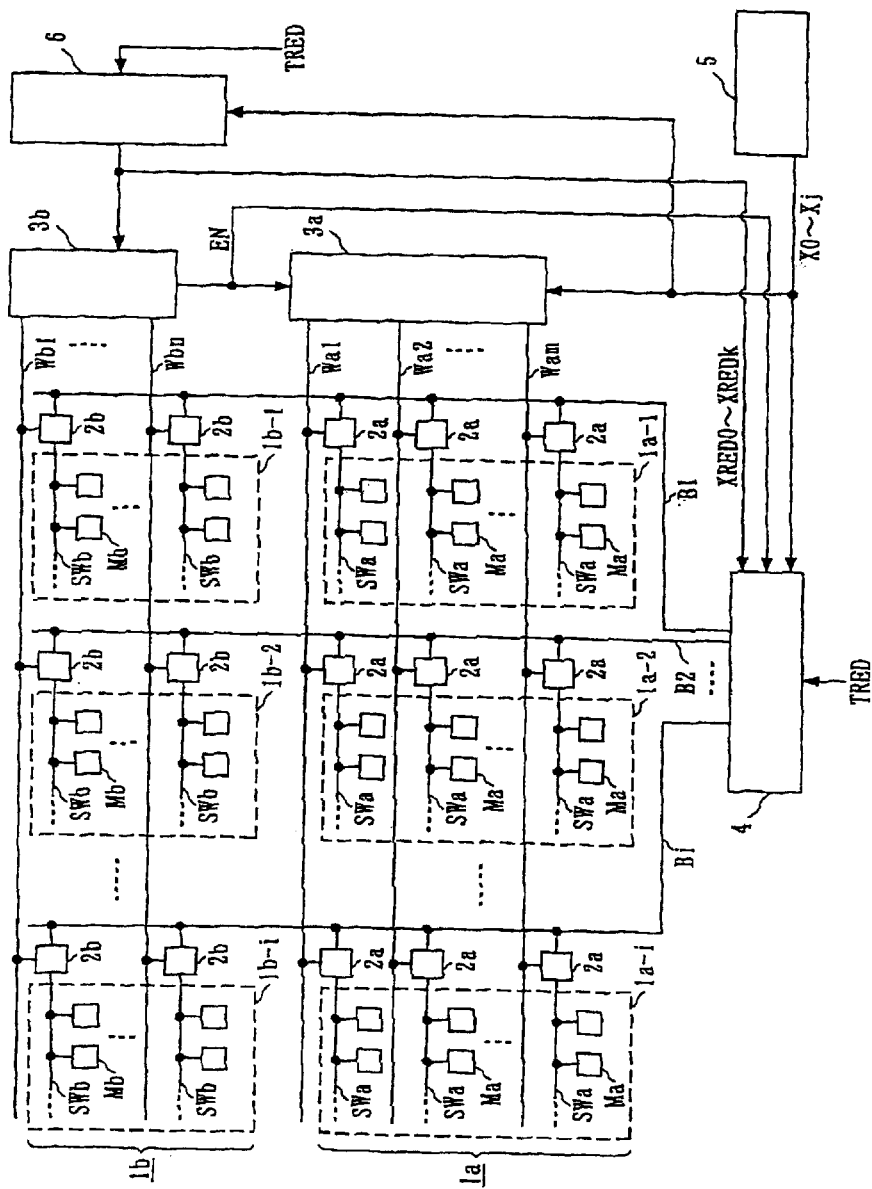
FIG. 3 which is a block diagram illustrative of a novel divided-word semiconductor memory device with redundant memory cell arrays for remedy of defective memory cells in normal memory cell arrays in a preferred embodiment in accordance with the present invention.
Figure 4:
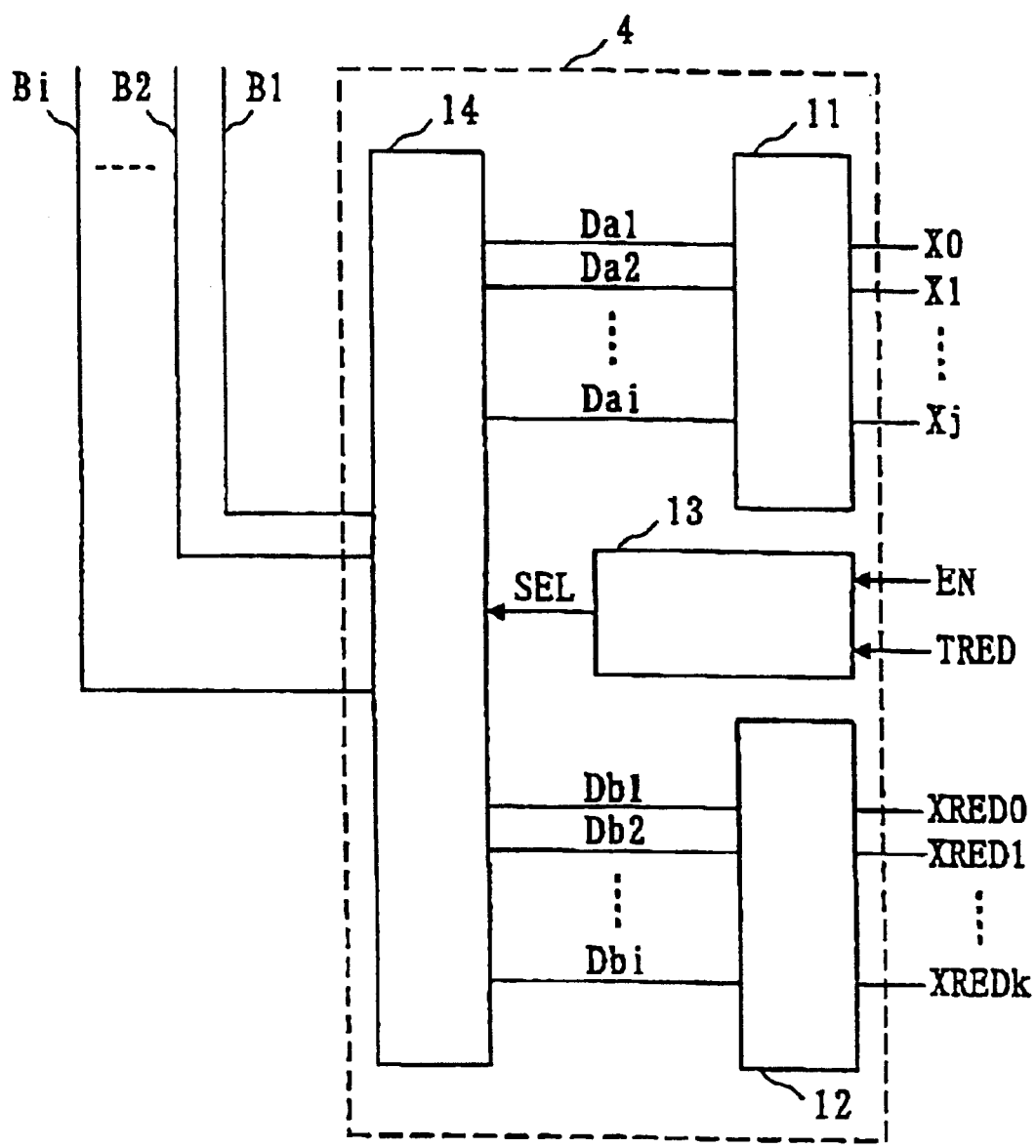
FIG. 4 is a block diagram illustrative of circuit configurations of the block selective line selecting circuit in the novel divided-word semiconductor memory device with redundant memory cell arrays in FIG. 3.

FIG. 4 is a block diagram illustrative of circuit configurations of the block selective line selecting circuit in the novel divided-word semiconductor memory device with redundant memory cell arrays in FIG. 3.

The block selective line selecting circuit 4 comprises a normal row address decode section 11, a redundant row address decode section 12, a controller 13 and an input signal switching section 14. The normal row address decode section 11 is connected to the row address circuit 5 for receiving the row address signals X0, X1, X2, X3 . . . Xj from the row address circuit 5 and subsequent decoding operations for decoding the row address signals X0, X1, X2, X3 . . . Xj into row address decode signals Da1, Da2, Da3, . . . Dai. The redundant row address decode section 12 is connected to the redundant fuse circuit 6 for receiving the redundant address signals XRED0, XRED1, XRED2, XRED3, . . . XREDk from the redundant fuse circuit 6 and subsequent decoding operations for decoding the redundant address signals XRED0, XRED1, XRED2, XRED3, . . . XREDk into redundant row address decode signals Db1, Db2, Db3, . . . Dbi. The input signal switching section 14 is connected to the normal row address decode section 11 for receiving the row address decode signals Da1, Da2, Da3, . . . Dai from the normal row address decode section 11 and also connected to the redundant row address decode section 12 for receiving the redundant row address decode signals Db1, Db2, Db3, . . . Dbi from the redundant row address decode section 12. The input signal switching section 14 is further connected to the block selective common lines b1, b2, b3, . . . bi. The controller 13 is connected to the redundant word line selective circuit 3b for receiving a redundant enable signal EN from the redundant word line selective circuit 3b. The controller 13 receives the test mode signal TRED externally supplied. The controller 13 generates a control signal in accordance with the redundant enable signal EN and the test mode signal TRED. The controller 13 is further connected to the input signal switching section 14 to send the input signal switching section 14 the control signal to control the input signal switching section 14 so that the input signal switching section 14 is switched into a first state to permit transmissions of the row address decode signals Da1, Da2, Da3, . . . Dai into the block selective common lines b1, b2, b3, . . . bi when a non-defective normal memory cell is selected, and also switched into a second state to permit transmissions of the redundant row address decode signals Db1, Db2, Db3, . . . Dbi into the block selective common lines b1, b2, b3, . . . bi when said defective normal memory cell is selected.

The row address decode signals Da1, Da2, Da3, . . . Dai correspond to the block selective common lines b1, b2, b3, . . . bi, respectively. The row address signals X0, X1, X2, X3 . . . Xj supplied from the row address circuit 5 have information of selecting any one of the block selective common lines b1, b2, b3, . . . bi. The normal row address decode section 11 decodes the row address signals X0, X1, X2, X3 . . . Xj into the row address decode signals Da1, Da2, Da3, . . . Dai, wherein a corresponding one of the row address decode signals Da1, Da2, Da3, . . . Dai to the selecting one of the block selective common lines b1, b2, b3, . . . bi is made by the normal row address decode section 11 into a selecting level, whilst the remaining row address decode signals are made into a non-selecting level.

The redundant row address decode signals Db1, Db2, Db3, . . . Dbi correspond to the block selective common lines b1, b2, b3, . . . bi, respectively. The redundant address signals XRED0, XRED1, XRED2, XRED3, . . . XREDk supplied from the redundant fuse circuit 6 have information of selecting any one of the block selective common lines b1, b2, b3, . . . bi. The redundant row address decode section 12 decodes the redundant address signals XRED0, XRED1, XRED2, XRED3, . . . XREDk into the redundant row address decode signals Db1, Db2, Db3, . . . Dbi, wherein a corresponding one of the redundant row address decode signals Db1, Db2, Db3, . . . Dbi to the selecting one of the block selective common lines b1, b2, b3, . . . bi is made by the redundant row address decode section 12 into a selecting level, whilst the remaining redundant row address decode signals are made into a non-selecting level.

In the test mode to the normal memory cells and in the normal mode, if a non-defective normal memory cell is selected in the normal memory cell array 1a, then the test mode signal TRED is in the inactivated level and the redundant enable signal EN is also in the inactivated level. The controller 13 receives the test mode signal TRED in the inactivated level and also receives the redundant enable signal EN in the inactivated level, then the controller 13 sets a switching control signal SEL into the first level, for example, high level.

In the normal mode, if a defective normal memory cell is selected in the normal memory cell array 1a, then the test mode signal TRED is in the inactivated level whilst the redundant enable signal EN is in the activated level. The controller 13 receives the test mode signal TRED in the inactivated level and also receives the redundant enable signal EN in the activated level, then the controller 13 sets a switching control signal SEL into the second level, for example, low level.

In the test mode to the redundant memory cells, the test mode signal TRED remains in the activated level. The controller 13 receives the test mode signal TRED in the activated level, then the controller 13 sets a switching control signal SEL into the first level, for example, high level.

Upon receipt of the switching control signal SEL in the first level, for example, high level, the input signal switching section 14 is switched into a first state to connect the normal row address decode section 11 into the block selective common lines b1, b2, b3, . . . bi, thereby permitting transmissions of the row address decode signals Da1, Da2, Da3, . . . Dai into the block selective common lines b1, b2, b3, . . . bi. Upon receipt of the switching control signal SEL in the second level, for example, low level, the input signal switching section 14 is switched into a second state to connect the redundant row address decode section 12 into the block selective common lines b1, b2, b3, . . . bi, thereby permitting transmissions of the redundant row address decode signals Db1, Db2, Db3, . . . Dbi into the block selective common lines b1, b2, b3, . . . bi.

The redundant fuse circuit 6 is connected to the row address circuit 5 for receiving the row address signals X0, X1, X2, X3 . . . Xj from the row address circuit 5, so that the redundant fuse circuit 6 generates the redundant address signals XRED0, XRED1, XRED2, XRED3, . . . XREDk in accordance with the row address signals X0, X1, X2, X3 . . . Xj, wherein the redundant address signals XRED0, XRED1, XRED2, XRED3, . . . XREDk have informations of designating redundant addresses. The redundant fuse circuit 6 has a plurality of fuses not illustrated. The row address signals X0, X1, X2, X3 . . . Xj from the row address circuit 5 provides a row address where a defective memory cell exists. The fuses in the redundant fuse circuit 6 have previously been disconnected to generate the redundant address signals XRED0, XRED1, XRED2, XRED3, ... XREDk which designates a redundant address of a redundant memory cell to be used in place of the defective memory cell. This operations to disconnect the fuses will be described below.

The following descriptions will focus on the test in the manufacturing processes for the semiconductor memory device. After the diffusion process has been completed, then probes are bonded by pressure welding to electrodes of the semiconductor memory device. A power supply and a tester are also connected to the semiconductor memory device. The test to the semiconductor memory device may be divided into two tests, for example, the test to the normal memory cell array la and the test to the redundant memory cell array 1b. The descriptions will be made of the test to the normal memory cell array la prior to the descriptions of the test to the redundant memory cell array 1b.

The test mode to the normal memory cell array la may be made as follows. The word lie selecting circuit 3a receives the row address signals X0, X1, X2, X3 ... Xj from the row address circuit 5 so that the word line selecting circuit 3a is operated to sequentially select the word lines Wa1, Wa2, Wa3, ... Wam. Since the row address signals X0, X1, X2, X3 ... Xj do not designate the redundant word lines Wb1, Wb2, Wb3, ... Wbn, the redundant word line selecting Circuit 3b does not select the redundant word lines Wb1, Wb2, Wb3, ... Wbn. Namely, the redundant word line selecting circuit 3b makes the redundant word lines Wb1, Wb2, Wb3, ... Wbn into the non-selective level.

In the test mode to the normal memory cell array 1a, the test mode signal TRED remains in inactivated level.

The redundant fuse circuit 6 at this stage has not yet carried out the disconnecting operation. This redundant fuse circuit 6 receiving the test mode signal TRED in the inactivated level sets the redundant address signals XRED0, XRED1, XRED2, XRED3, ... XREDk into the nonselective level so as not to select the redundant word lines Wb1, Wb2, Wb3, ... Wbn. The redundant fuse circuit 6 sets the redundant enable signal EN into the inactivated level.

Since the redundant enable signal EN and the test mode signal TRED are in the inactivated level, then the controller 13 sets the switching control signal SEL into the first level, for example, high level. Upon receipt of the switching control signal SEL in the first level, for example, high level, the input signal switching section 14 is switched into a first state to connect the normal row address decode section 11 into the block selective common lines b1, b2, b3, ... bi, thereby permitting transmissions of the row address decode signals Da1, Da2, Da3, ... Dai into the block selective common lines b1, b2, b3, ... bi.

Accordingly, the block selective line selecting circuit 4 is operated to place into the selecting level a corresponding one of the block selective common lines b1, b2, b3, ... bi to the selecting one of the row address signals X0, X1, X2, X3 ... Xj, whilst to place the remaining block selective lines into the non-selecting level.

In the sub-word drivers 2a connected to the selected one of the word lines Wa1, Wa2, Wa3, ... Wam, a selected one of the sub-word drivers 2a being connected to the selected one of the block selective common lines b1, b2, b3, ... bi is activated to connect the sub-word line SWa to the selected one of the word lines Wa1, Wa2, Wa3, ... Wam. In the sub-word drivers 2a connected to the selected one of the word lines Wa1, Wa2, Wa3, ... Wam, the remaining sub-word drivers being connected to the remaining non-selected block selective lines are inactivated not to connect the sub-word line SWa to the word lines Wa1, Wa2, Wa3, ... Wam. Further, the sub-word drivers 2a connected to the non-selected word lines are also inactivated not to connect the sub-word line SWa to the word lines Wa1, Wa2, Wa3, ... Wam.

In the meantime, the semiconductor memory device also has a column address circuit not illustrated which generates column address signals to be transmitted to a digit line selective circuit not illustrated, so that the digit line selective circuit is operated to select any one of the digit lines.

Consequently, a predetermined test mode signal is written into and then read out a selected one of the normal memory cells Ma designated by both the selected one of the sub-word lines SWa and the selected one of the digit lines, so that any defective one of the normal memory cells Ma can be detected. If the currently tested one of the normal memory cells Ma is defective, then the address of the defective one of the normal memory cells Ma is stored into the tester. The above operations will be made to all of the normal memory cells Ma one by one.

The subsequent descriptions will focus on the test to the redundant memory cell array 1b. The test to the redundant memory cell array 1b may be made as follows. The redundant fuse circuit 6 receives the row address signals X0, X1, X2, X3 ... Xj from the row address circuit 5. In the test mode to the redundant memory cell array 1b, the test mode signal TRED remains in the activated level.

The redundant fuse circuit 6 at this stage has not yet carried out the disconnecting operation. This redundant fuse circuit 6 receiving the test mode signal TRED in the activated level generates the redundant address signals XRED0, XRED1, XRED2, XRED3, ... XREDk for sequentially selecting the redundant word lines Wb1, Wb2, Wb3, ... Wbn in accordance with the row address signals X0, X1, X2, X3 ... Xj.

The redundant word line selecting circuit 3b selects sequentially the redundant word lines Wb1, Wb2, Wb3, ... Wbn in accordance with the redundant address signals XRED0, XRED1, XRED2, XRED3, ... XREDk. The redundant word line selecting circuit 3b also sets the redundant enable signal EN into the activated level. This redundant enable signal EN in the activated level is transmitted to the word line selecting circuit 3a. Upon receipt of the redundant enable signal EN in the activated level, the word line selecting circuit 3a sets all of the word lines Wa1, Wa2, Wa3, ... Wam into the non-selected level.

Since the test mode signal TRED is in the activated level, then the controller 13 sets the switching control signal SEL into the first level, for example, high level. Upon receipt of the switching control signal SEL in the first level, for example, high level, the input signal switching section 14 is switched into a first state to connect the normal row address decode section 11 into the block selective common lines b1, b2, b3, ... bi, thereby permitting transmissions of the row address decode signals Da1, Da2, Da3, ... Dai into the block selective common lines b1, b2, b3, ... bi.

Accordingly, the block selective line selecting circuit 4 is operated to place into the selecting level a corresponding one of the block selective common lines b1, b2, b3, ... bi to the selecting one of the row address signals X0, X1, X2, X3 ... Xj, whilst to place the remaining block selective lines into the non-selecting level.

In the redundant sub-word drivers 2b connected to the selected one of the redundant word lines Wb1, Wb2, Wb3, ... Wbn, a selected one of the redundant sub-word drivers 2b being connected to the selected one of the block selective common lines b1, b2, b3, ... bi is activated to connect the redundant sub-word line SWb to the selected one of the redundant word lines Wb1, Wb2, Wb3, . . . Wbn. In the redundant sub-word drivers 2b connected to the selected one of the redundant word lines Wb1, Wb2, Wb3, . . . Wbn, the remaining redundant sub-word drivers being connected to the remaining non-selected redundant block selective lines are inactivated not to connect the redundant sub-word line SWb to the redundant word lines Wb1, Wb2, Wb3, . . . Wbn. Further, the redundant sub-word drivers 2b connected to the non-selected redundant word lines are also inactivated not to connect the redundant sub-word line SWb to the redundant word lines Wb1, Wb2, Wb3, . . . Wbn.

In the meantime, the column address circuit not illustrated generates the column address signals to be transmitted to a digit line selective circuit not illustrated, so that the digit line selective circuit is operated to select any one of the digit lines.

Consequently, a predetermined test mode signal is written into and then read out a selected one of the redundant memory cells Mb designated by both the selected one of the redundant sub-word lines SWb and the selected one of the digit lines, so that any defective one of the redundant memory cells Mb can be detected. If the currently tested one of the redundant memory cells Mb is defective, then the address of the defective one of the redundant memory cells Mb is stored into the tester. The above operations will be made to all of the redundant memory cells Mb one by one.

After the tests have been completed, then it is confirmed whether or not it is possible to replace the defective memory cells in the normal memory cell array la by non-defective redundant memory cells in the redundant memory cell arrays 21b. If possible, data are prepared of the numbers of the fuses corresponding to the row addresses which designate the defective memory cells.

In the normal mode, the row address of the defective memory cell is designated by the row address signals X0, X1, X2, X3 . . . Xj, wherein the row address signals X0, X1, X2, X3 . . . Xj from the row address circuit 5 provides the row address where the defective memory cell exists. The fuses in the redundant fuse circuit 6 are so disconnected by the trimmer machine in accordance with the address data as to generate the redundant address signals XRED0, XRED1, XRED2, XRED3, . . . XREDk which designate the redundant address of the non-defective redundant memory cell to be used in place of the defective memory cell.

The following descriptions will be concerned with the operations of the semiconductor memory device in the normal mode in case when the non-defective normal memory cells are selected, assuming that the defective memory cell exists at the row address "3" in the normal memory cell array la whilst the row address "1" is entered to be selected, provided the column address is optional. The row address "3" is given by the row address signals X0=high level, X1=high level, X2=low level, X3=low level . . . Xj=low level. The row address "1" is given by the row address signals X0=high level, X1=low level, X2=low level, X3=low level . . . Xj=low level.

When the row address signals X0, X1, X2, X3 . . . Xj not designating the defective memory cell are entered, then the redundant fuse circuit 6 is operated to set the redundant address signals XRED0, XRED1, XRED2, XRED3, . . . XREDk into the non-selective level so as not to designate the redundant word lines Wb1, Wb2, Wb3, . . . Wbn and also set the redundant enable signal EN into the inactivated level.

Since the redundant enable signal EN is in the inactivated level, then the word line selecting circuit 3a selects one of the word lines Wa1, Wa2, Wa3, . . . Wam in accordance with the row address signals X0, X1, X2,X3 . . . Xj.

In the normal mode, the test mode signal TRED externally supplied remains in the inactivated level.

Since the redundant enable signal EN and the test mode signal TRED are in the inactivated level, then the controller 13 sets the switching control signal SEL into the first level, for example, high level. Upon receipt of the switching control signal SEL in the first level, for example, high level, the input signal switching section 14 is switched into a first state to connect the normal row ad section 11 into the block selective common lines b1, b2, b3, . . . bi, thereby permitting transmissions of the row address decode signals Da1, Da2, Da3, . . . Dai into the block selective common lines b1, b2, b3, . . . bi.

Accordingly, the block selective line selecting circuit 4 is operated to place into the selecting level a corresponding one of the block selective common lines b1, b2, b3, . . . bi to the selecting one of the row address signals X0, X1, X2, X3 . . . Xj, whilst to place the remaining block selective lines into the non-selecting level.

In the sub-word drivers 2a connected to the selected one of the word lines Wa1, Wa2, Wa3, . . . Wam, a selected one of the sub-word drivers 2a being connected to the selected one of the block selective common lines b1, b2, b3, . . . bi is activated to connect the sub-word line SWa to the selected one of the word lines Wa1, Wa2, Wa3, . . . Warn In the sub-word drivers 2a connected to the selected one of the word lines Wa1, Wa2, Wa3, . . . Wam, the remaining sub-word drivers being connected to the remaining non-selected block selective lines are inactivated not to connect the sub-word line SWa to the word lines Wa1, Wa2, Wa3, . . . Wam. Further, the sub-word drivers 2a connected to the non-selected word lines are also inactivated not to connect the sub-word line SWa to the word lines Wa1, Wa2, Wa3, . . . Wam. Furthermore, the redundant sub-word drivers 2b are also inactivated not to connect the redundant sub-word line SWb to the redundant word lines Wb1, Wb2, Wb3, . . . Wbm.

In the meantime, the column address signals are transmitted to a digit line selective circuit not illustrated, so that the digit line selective circuit is operated to select any one of the digit lines.

Consequently, a real datum is written into and then read out a selected one of the normal memory cells Ma designated by both the selected one of the sub-word lines SWa and the selected one of the digit lines.

The following descriptions will be concerned with the other operations of the semiconductor memory device in the normal mode in case when the non-defective normal memory cells are selected, assuming that the defective memory cell exists at the row address "3" in the normal memory cell array la and this address "3" is entered to be selected, provided the column address is optional. The row address "3" is given by the row address signals X0=high level, X1=high level, X2=low level, X3=low level . . . Xj=low level.

When the row address signals X0, X1, X2, X3 . . . Xj designating the defective memory cell are entered, then the redundant fuse circuit 6 is operated to set the redundant address signals XRED0, XRED1, XRED2, XRED3, . . . XREDk so as to designate the redundant word lines Wb1, Wb2, Wb3, . . . Wbn and also set the redundant enable signal EN into the activated level, so that the redundant word selective line selecting circuit 3b is operated to select one of the redundant word lines Wb1, Wb2, Wb3, . . ., Wbn in accordance with the row address signals X0, X1, X2, X3 . . . Xj. Also the word line selective circuit 3a is inactivated to set all of the word lines Wa1, Wa2, Wa3, . . . Wam into the non-selective level.

In the normal mode, the test mode signal TRED externally supplied remains in the inactivated level.

Since the test mode signal TRED is in the inactivated level whilst the redundant enable signal EN is in the activated level, then the controller 13 sets the switching control signal SEL into the second level, for example, low level. Upon receipt of the switching control signal SEL in the second level, for example, low level, the input signal switching section 14 is switched into a second state to connect the redundant row address decode section 12 into the block selective common lines b1, b2, b3, . . . bi, thereby permitting transmissions of the redundant row address decode signals Db1, Db2, Db3, . . . Dbi into the block selective common lines b1, b2, b3, . . . bi.

Accordingly, the block selective line selecting circuit 4 is operated to place into the selecting level a corresponding one of the block selective common lines b1, b2, b3, . . . bi to the selecting one of the redundant row address signals XRED0, XRED1, XRED2, XRED3 . . . XREDk, whilst to place the remaining block selective lines into the non-selecting level.

In the redundant sub-word drivers 2b connected to the selected one of the redundant word lines Wb1, Wb2, Wb3, . . . Wbm, a selected one of the redundant sub-word drivers 2b being connected to the selected one of the block selective common lines b1, b2, b3, . . . bi is activated to connect the redundant sub-word line SWb to the selected one of the redundant word lines W1, Wb2, Wb3, . . . Wbn. In the redundant sub-word drivers 2b connected to the selected one of the redundant word lines Wb1, Wb2, Wb3, . . . Wbn, the remaining redundant sub-word drivers being connected to the remaining non-selected block selective lines are inactivated not to connect the redundant sub-word line SWb to the redundant word lines Wb1, Wb2, Wb3, . . . Wbm. Since the word lines Wa1, Wa2, Wa3, . . . Wam are in the non-selected level, then the sub-word drivers 2a are inactivated so as not to connect the sub-word lines SWa into the word lines Wa1, Wa2, Wa3, . . . Wam.

In the meantime, the column address signals are transmitted to a digit line selective circuit not illustrated, so that the digit line selective circuit is operated to select any one of the digit lines.

Consequently, a real datum is written into and then read out a selected one of the redundant memory cells Mb designated by both the selected one of the redundant sub-word lines SWb and the selected one of the digit lines.

As described above, the word line selecting circuit 3a receives the row address signals X0, X1, X2, X3 . . . Xj from the row address circuit 5 whilst the redundant word line selecting circuit 3b receives the redundant row address signals XRED0, XRED1, XRED2, XRED3 . . . XREDk from the redundant fuse circuit 6. If one of the word lines Wa1, Wa2, Wa3, . . . Wam is selected, then all of the redundant word lines Wb1, Wb2, Wb3, . . . Wbn are not selected. If one of the redundant word lines Wb1, Wb2, Wb3, . . . Wbn is selected, then all of the word lines Wa1, Wa2, Wa3, . . . Wam are not selected. Even the block selective lines are common to both the normal memory cell blocks and the redundant memory cell blocks, any one of the normal memory cell and the redundant memory cell is selected.

The above novel semiconductor memory device requires the single block selective line selecting circuit for selecting the block selective lines commonly connected to both the normal and redundant memory cell blocks in the normal and redundant memory cell arrays. This makes it possible to reduce the scale of the circuits of the semiconductor memory device. This further makes it possible to reduce the area of the chip having the semiconductor memory device.

The provision of the common block lines results in a reduction in the total number of the bock selective lines. This makes it possible to reduce the scale of the circuits of the semiconductor memory device. This further makes it possible to reduce the area of the chip having the semiconductor memory device.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A semiconductor memory device having a block selective line structure comprising a plurality of block selective common lines, each of which is commonly connected to both corresponding normal and redundant memory cell blocks in normal and redundant memory cell arrays, wherein said plurality of block selective common lines are connected to a block selective line selecting circuit, which is operated to select a first one of said plurality of block selective common lines when a non-defective normal memory cell belonging to said first one of said plurality of block selective common lines is selected in said normal memory cell array, and also which is operated to select a second one of said plurality of block selective common lines when a defective normal memory cell belonging to said second one of said plurality of block selective common lines is selected in said normal memory cell array, wherein said block selective line selecting circuit is switched into a first state to permit transmission of decoded normal row address signals having information designating a normal row address to which a normal memory cell to be selected belongs when said non-defective normal memory cell is selected, and also switched into a second state to permit transmission of decoded redundant row address signals having information designating a redundant row address to which a redundant memory cell to be selected belongs when said defective normal memory cell is selected.

2. The semiconductor memory device as claimed in claim 1, wherein said block selective line selecting circuit comprises:

a normal row address decode section for decoding normal row address signals;

a redundant row address decode section for decoding redundant row address signals;

a switching section connected to said normal and redundant row address decode sections and also connected to said block selective common lines; and a controller connected to said switching section for controlling switching operations of said switching section so as to permit transmissions of said decoded normal row address signals when said non-defective normal memory cell is selected, and also to permit transmissions of said decoded redundant row address signals when said defective normal memory cell is selected.

3. A semiconductor memory device having a block selective line structure comprising a plurality of block selective common lines, each of which is commonly connected to both corresponding normal and redundant memory cell blocks in normal and redundant memory cell arrays, wherein said plurality of block selective common lines are connected to a block selective line selecting circuit, which is operated to select a first one of said plurality of block selective common lines when a non-defective normal memory cell belonging to said first one of said plurality of block selective common lines is selected in said normal memory cell array, and also which is operated to select a second one of said plurality of block selective common lines when a defective normal memory cell belonging to said second one of said plurality of block selective common lines is selected in said normal memory cell array, wherein each of said block selective common lines is also connected through normal and redundant memory cell block switching elements to normal and redundant memory cells in said normal and redundant memory cell blocks respectively belonging to said each common block line selective line, wherein said normal memory cell block switching elements are connected through normal word lines to a normal word line selecting circuit which is operated to select one of said normal word lines when said non-defective normal memory cell is selected, and also which is operated not to select any of said normal word lines when said defective normal memory cell is selected, and wherein said redundant memory cell block switching elements are connected through redundant word lines to a redundant word line selecting circuit which is operated to select one of said redundant word lines when said defective normal memory cell is selected, and also which is operated not to select any of said redundant word lines when said non-defective normal memory cell is selected.

4. The semiconductor memory device as claimed in claim 3, wherein said normal word line selecting circuit is connected to a row address circuit for receiving normal row address signals having informations of designating a normal row address to which a normal memory cell to be selected belongs, and said redundant word line selecting circuit is connected to a redundant fuse circuit for receiving said redundant address signals having informations of designating a redundant row address to which a redundant memory cell to be selected belongs.

5. The semiconductor memory device as claimed in claim 4, wherein said normal word line selecting circuit is connected to said redundant word line selecting circuit for receiving a redundant enable signal.

6. A semiconductor memory device having a block selective line selecting circuit connected to a plurality of block selective common lines, each of which is commonly connected to both corresponding normal and redundant memory cell blocks in normal and redundant memory cell arrays, wherein said block selective line selecting circuit is switched into a first state to permit transmissions of decoded normal row address signals having informations of designating a normal row address to which a normal memory cell to be selected belongs when a non-defective normal memory cell is selected in said normal memory cell array, and also said block selective line selecting circuit is switched into a second state to permit transmissions of decoded redundant row address signals having informations of designating a redundant row address to which a redundant memory cell to be selected belongs when a defective normal memory cell is selected in said normal memory cell array.

7. The semiconductor memory device as claimed in claim 6, wherein said block selective line selecting circuit comprises:

a normal row address decode section for decoding normal row address signals;

a redundant row address decode section for decoding redundant row address signals;

a switching section connected to said normal and redundant row address decode sections and also connected to said block selective common lines; and a controller connected to said switching section for controlling switching operations of said switching section so as to permit transmissions of said decoded normal row address signals when said non-defective normal memory cell is selected, and also to permit transmissions of said decoded redundant row address signals when said defective normal memory cell is selected.

8. The semiconductor memory device as claimed in claim 6, wherein each of said block selective common lines is also connected through normal and redundant memory cell block switching elements to normal and redundant memory cells in said normal and redundant memory cell blocks respectively belonging to said each common block line selective line, wherein said normal memory cell block switching elements are connected through normal word lines to a normal word line selecting circuit which is operated to select one of said normal word lines when said non-defective normal memory cell is selected, and also which is operated not to select any of said normal word lines when said defective normal memory cell is selected, and wherein said redundant memory cell block switching elements are connected through redundant word lines to a redundant word line selecting circuit which is operated to select one of said redundant word lines when said defective normal memory cell is selected and also which is operated not to select any of said redundant word lines when said non-defective normal memory cell is selected.

9. The semiconductor memory device as claimed in claim 8, wherein said normal word line selecting circuit is connected to a row address circuit for receiving normal row address signals having informations of designating a normal row address to which a normal memory cell to be selected belongs, and said redundant word line selecting circuit is connected to a redundant fuse circuit for receiving said redundant address signals having informations of designating a redundant row address to which a redundant memory cell to be selected belongs.

10. The semiconductor memory device as claimed in claim 9, wherein said normal word line selecting circuit is connected to said redundant word line selecting circuit for receiving a redundant enable signal.

11. A semiconductor memory device having a block selective line selecting circuit comprises:

a normal row address decode section for decoding normal row address signals;

a redundant row address decode section for decoding redundant row address signals;

a switching section connected to said normal and redundant row address decode sections and also connected to connected to a plurality of block selective lines; and a controller connected to said switching section for controlling switching operations of said switching section so that said switching section is switched into a first state to permit transmissions of decoded normal row address signals having informations of designating a normal row address to which a normal memory cell to be selected belongs when a non-defective normal memory cell is selected in said normal memory cell array, and also said switching section is switched into a second state to permit transmissions of decoded redundant row address signals having informations of designating a redundant row address to which a redundant memory cell to be selected belongs when a defective normal memory cell is selected in said normal memory cell array.

12. The semiconductor memory device as claimed in claim 11, wherein each of said block selective lines comprises a block selective common line commonly connected to both corresponding normal and redundant memory cell blocks in normal and redundant memory cell arrays.

13. The semiconductor memory device as claimed in claim 12,
wherein each of said block selective common lines is also connected through normal and redundant memory cell block switching elements to normal and redundant memory cells in said normal and redundant memory cell blocks respectively belonging to said each common block line selective line,
wherein said normal memory cell block switching elements are connected through normal word lines to a normal word line selecting circuit which is operated to select one of said normal word lines when said non-defective normal memory cell is selected, and also which is operated not to select any of said normal word lines when said defective normal memory cell is selected, and
wherein said redundant memory cell block switching elements are connected through redundant word lines to a redundant word line selecting circuit which is operated to select one of said redundant word lines when said defective normal memory cell is selected, and also which is operated not to select any of said redundant word lines when said non-defective normal memory cell is selected.

14. The semiconductor memory device as claimed in claim 13, wherein said normal word line selecting circuit is connected to a row address circuit for receiving normal row address signals having informations of designating a normal row address to which a normal memory cell to be selected belongs, and said redundant word line selecting circuit is connected to a redundant fuse circuit for receiving said redundant address signals having informations of designating a redundant row address to which a redundant memory cell to be selected belongs.

15. The semiconductor memory device as claimed in claim 14, wherein said normal word line selecting circuit is connected to said redundant word line selecting circuit for receiving a redundant enable signal.

16. A semiconductor memory device having a word selecting circuitry comprising;
a normal word line selecting circuit connected to a row address circuit for receiving normal row address signals having informations of designating a normal row address to which a normal memory cell to be selected belongs, and also said normal word line selecting circuit connected to a plurality of normal word lines for selecting one of said normal word lines in accordance with said normal row address signals when a non-defective normal memory cell is selected, and also selecting none of said normal word lines when said defective normal memory cell is selected and
a redundant word line selecting circuit connected to a redundant fuse circuit for receiving redundant address signals having informations of designating a redundant row address to which a redundant memory cell to be selected belongs, and also said redundant word line selecting circuit connected to a plurality of redundant word lines for selecting one of said redundant word lines in accordance with said redundant row address signals when said defective normal memory cell is selected, and also selecting none of said redundant word lines when said non-defective normal memory cell is selected.

17. The semiconductor memory device as claimed in claim 16, wherein said normal word line selecting circuit is connected to said redundant word line selecting circuit for receiving a redundant enable signal.

18. A semiconductor memory device having a block selective line selecting circuit connected to a plurality of block selective common lines, a normal word line selecting circuit, and a redundant word line selecting circuit,
wherein each of said plurality of block selective common lines is commonly connected to both corresponding normal and redundant memory cell blocks in normal and redundant memory cell arrays,
wherein said block selective line selecting circuit is switched into a first state to permit transmissions of decoded normal row address signals having informations of designating a normal row address to which a normal memory cell to be selected belongs when a non-defective normal memory cell is selected in said normal memory cell array, and also said block selective line selecting circuit is switched into a second state to permit transmissions of decoded redundant row address signals having informations of designating a redundant row address to which a redundant memory cell to be selected belongs when a defective normal memory cell is selected in said normal memory cell array;
wherein said normal word line selecting circuit is connected to a row address circuit for receiving normal row address signals having informations of designating a normal row address to which a normal memory cell to be selected belongs, and also said normal word line selecting circuit connected to a plurality of normal word lines for selecting one of said normal word lines in accordance with said normal row address signals when a non-defective normal memory cell is selected, and also selecting none of said normal word lines when said defective normal memory cell is selected; and
wherein said redundant word line selecting circuit being connected to a redundant fuse circuit for receiving redundant address signals having informations of designating a redundant row address to which a redundant memory cell to be selected belongs, and also said redundant word line selecting circuit connected to a plurality of redundant word lines for selecting one of said redundant word lines in accordance with said redundant row address signals when said defective normal memory cell is selected, and also selecting none of said redundant word lines when said non-defective normal memory cell is selected.

19. The semiconductor memory device as claimed in claim 17, wherein said block selective line selecting circuit comprises:
a normal row address decode section for decoding normal row address signals;
a redundant row address decode section for decoding redundant row address signals;

a switching section connected to said normal and redundant row address decode sections and also connected to said block selective common lines; and a controller connected to said switching section for controlling switching operations of said switching section so as to permit transmissions of said decoded normal row address signals when said non-defective normal memory cell is selected, and also to permit transmissions of said decoded redundant row address signals when said defective normal memory cell is selected.

20. The semiconductor memory device as claimed in claim 18, wherein said normal word line selecting circuit is connected to a row address circuit for receiving normal row address signals having informations of designating a normal row address to which a normal memory cell to be selected belongs, and said redundant word line selecting circuit is connected to a redundant fuse circuit for receiving said redundant address signals having informations of designating a redundant row address to which a redundant memory cell to be selected belongs.

21. The semiconductor memory device as claimed in claim 20, wherein said normal word line selecting circuit is connected to said redundant word line selecting circuit for receiving a redundant enable signal.

* * * * *